(12) United States Patent
Lin et al.

(10) Patent No.: US 12,176,412 B2
(45) Date of Patent: Dec. 24, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Hsiao Wen Lee, Hsinchu (TW); Yu-Shan Cheng, Hsinchu (TW); Ming-Ching Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 553 days.

(21) Appl. No.: 17/493,699

(22) Filed: Oct. 4, 2021

(65) Prior Publication Data
US 2022/0310819 A1 Sep. 29, 2022

Related U.S. Application Data

(60) Provisional application No. 63/166,625, filed on Mar. 26, 2021.

(51) Int. Cl.
*H01L 29/49* (2006.01)
*H01L 21/02* (2006.01)
(Continued)

(52) U.S. Cl.
CPC ...... *H01L 29/4991* (2013.01); *H01L 21/0259* (2013.01); *H01L 21/28123* (2013.01);
(Continued)

(58) Field of Classification Search
CPC .......... H01L 21/02603; H01L 21/0259; H01L 21/28123; H01L 21/28141;
(Continued)

(56) References Cited

U.S. PATENT DOCUMENTS 11,728,378 B2 * 8/2023 Tang ................... H01L 29/0649
257/522
2015/0263122 A1 * 9/2015 Hsiao .................... H01L 29/515
438/283
(Continued)

*Primary Examiner* — David C Spalla
(74) *Attorney, Agent, or Firm* — FOLEY & LARDNER LLP

(57) ABSTRACT

A semiconductor device includes a channel structure, extending along a first lateral direction, that is disposed over a substrate. The semiconductor device includes a gate structure, extending along a second lateral direction perpendicular to the first lateral direction, that straddles the channel structure. The semiconductor device includes an epitaxial structure, coupled to the channel structure, that is disposed next to the gate structure. The semiconductor device includes a first gate spacer and a second gate spacer each comprising a first portion disposed between the gate structure and the epitaxial structure along the first lateral direction. The semiconductor device includes an air gap interposed between the first portion of the first gate spacer and the first portion of the second gate spacer. The air gap exposes a second portion of the first gate spacer that extends in the first lateral direction.

20 Claims, 24 Drawing Sheets

(51) Int. Cl.
*H01L 21/28* (2006.01)
*H01L 29/06* (2006.01)
*H01L 29/423* (2006.01)
*H01L 29/66* (2006.01)
*H01L 29/786* (2006.01)

(52) U.S. Cl.
CPC .... *H01L 29/0665* (2013.01); *H01L 29/42392* (2013.01); *H01L 29/4908* (2013.01); *H01L 29/6653* (2013.01); *H01L 29/66545* (2013.01); *H01L 29/6656* (2013.01); *H01L 29/66742* (2013.01); *H01L 29/78618* (2013.01); *H01L 29/78696* (2013.01)

(58) Field of Classification Search
CPC ..... H01L 21/823431; H01L 21/823821; H01L 21/845; H01L 27/0886; H01L 27/0924; H01L 27/1211; H01L 29/0653; H01L 29/0665; H01L 29/0669; H01L 29/0673; H01L 29/41791; H01L 29/42392; H01L 29/4908; H01L 29/4991; H01L 29/66439; H01L 29/66545; H01L 29/6653; H01L 29/66553; H01L 29/6656; H01L 29/66742; H01L 29/66795; H01L 29/775; H01L 29/785; H01L 29/7851; H01L 29/7853; H01L 29/7855; H01L 29/78618; H01L 29/78696; H01L 2029/7858

See application file for complete search history.

(56) References Cited

U.S. PATENT DOCUMENTS

| 2016/0163816 | A1* | 6/2016 | Yu ................... H01L 29/6653 438/283 |
| 2018/0233398 | A1* | 8/2018 | Van Cleemput ...... H01L 21/768 |
| 2019/0296123 | A1* | 9/2019 | Lee ..................... H01L 29/512 |
| 2020/0020567 | A1* | 1/2020 | Sun ................... H01L 21/31053 |
| 2020/0219989 | A1* | 7/2020 | Cheng ................ H01L 29/6656 |

* cited by examiner

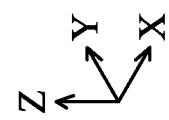
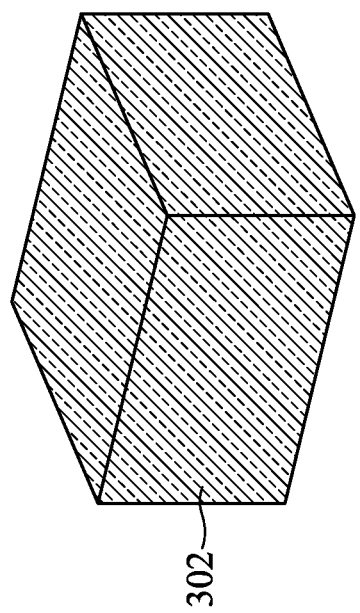
FIG. 3

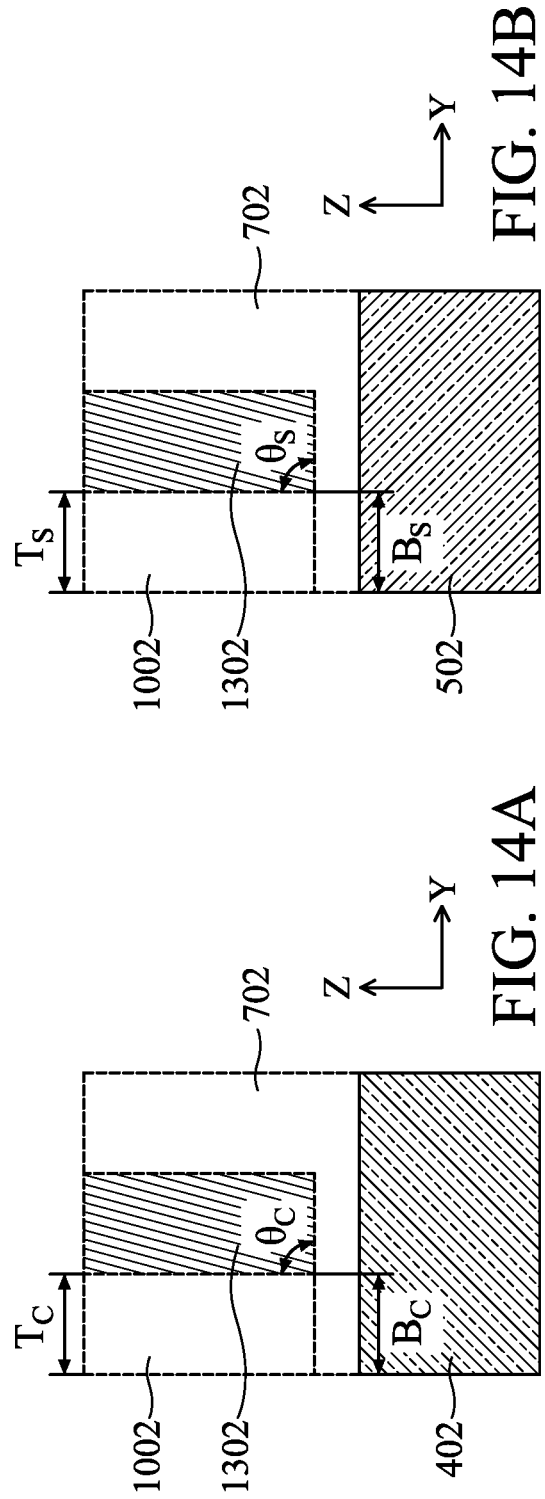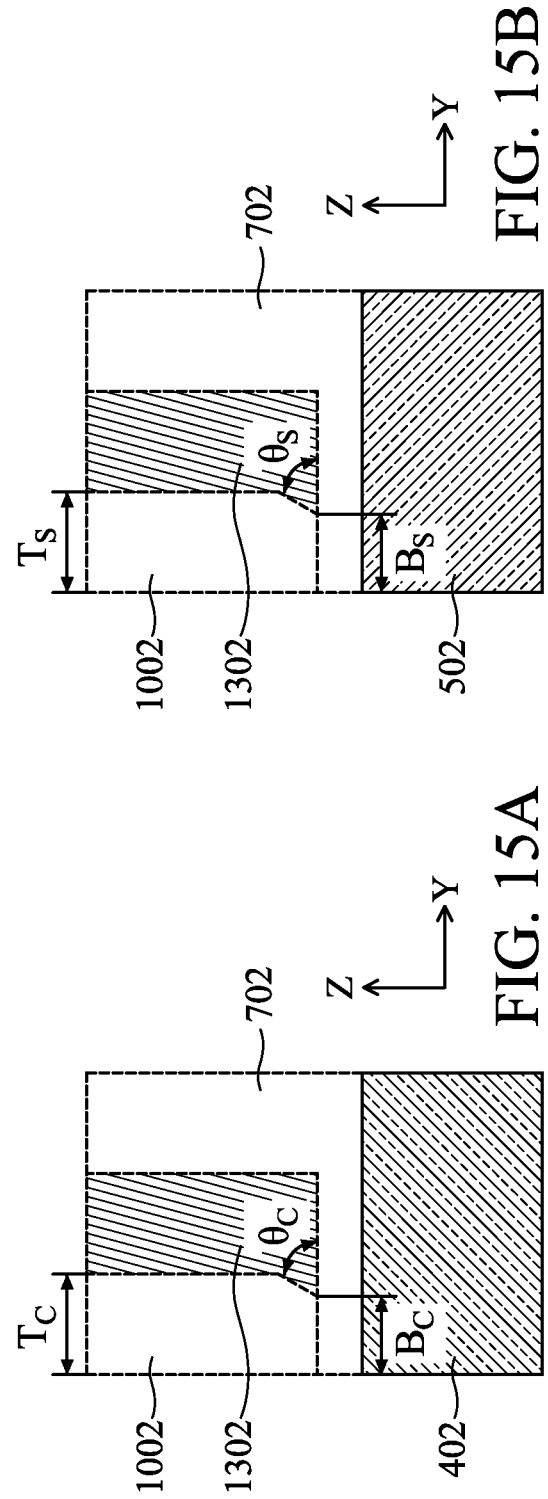

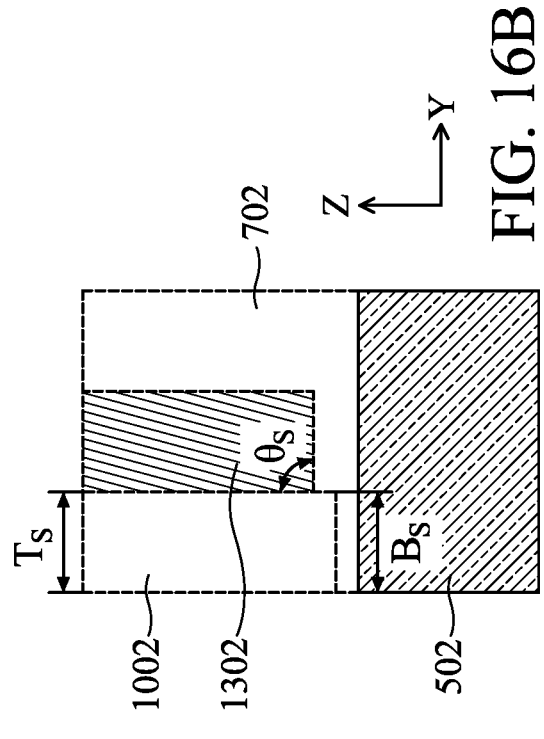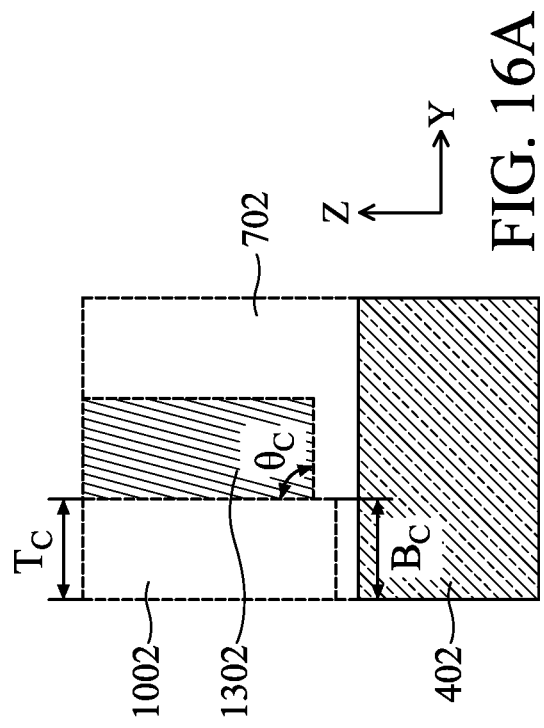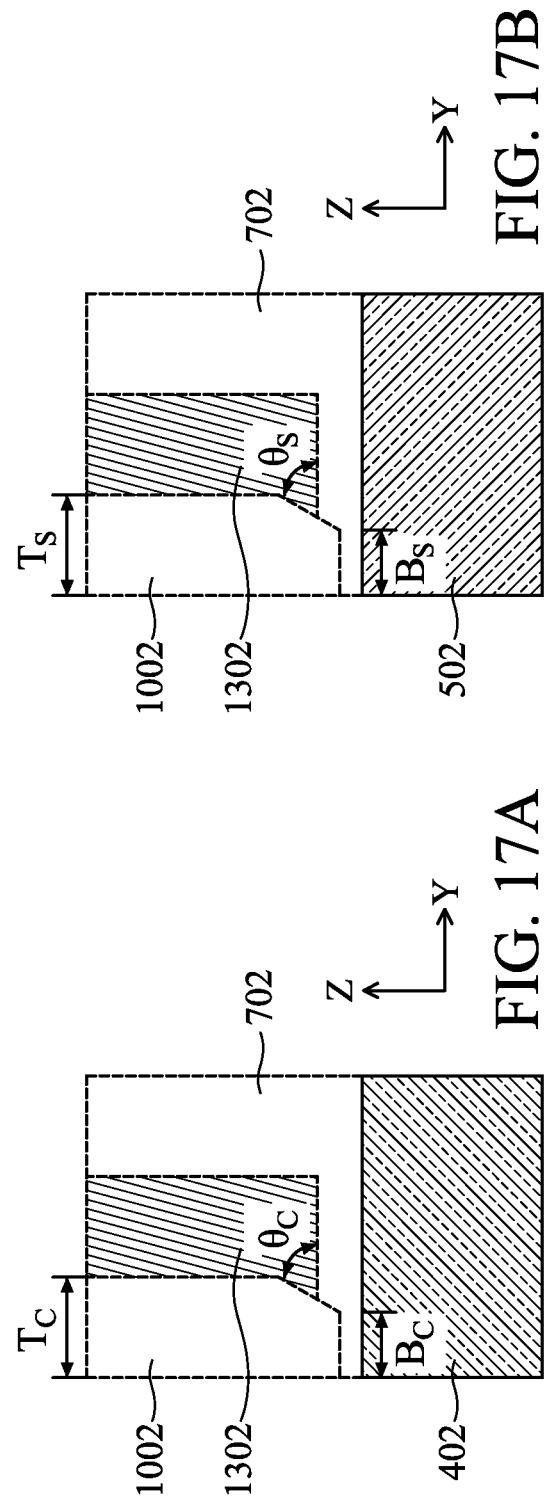

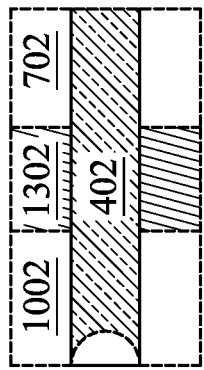
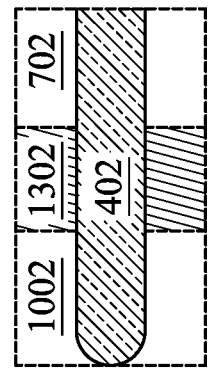
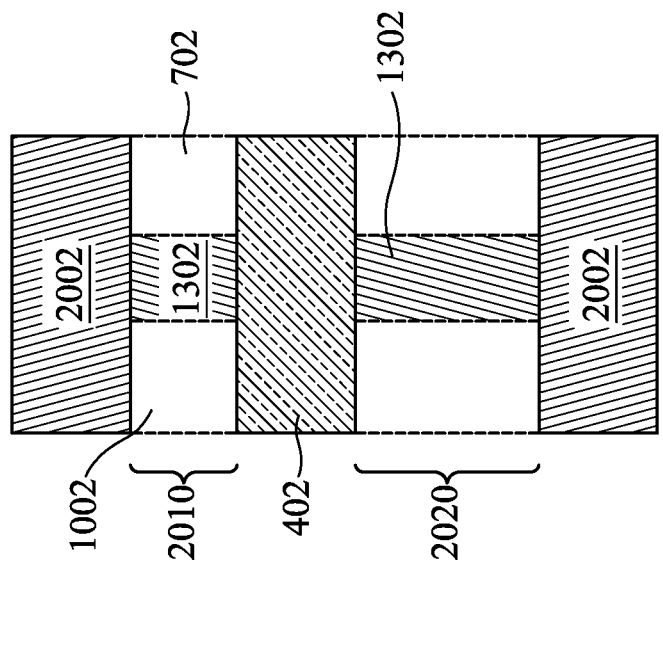
FIG. 20B
FIG. 20C
FIG. 20A

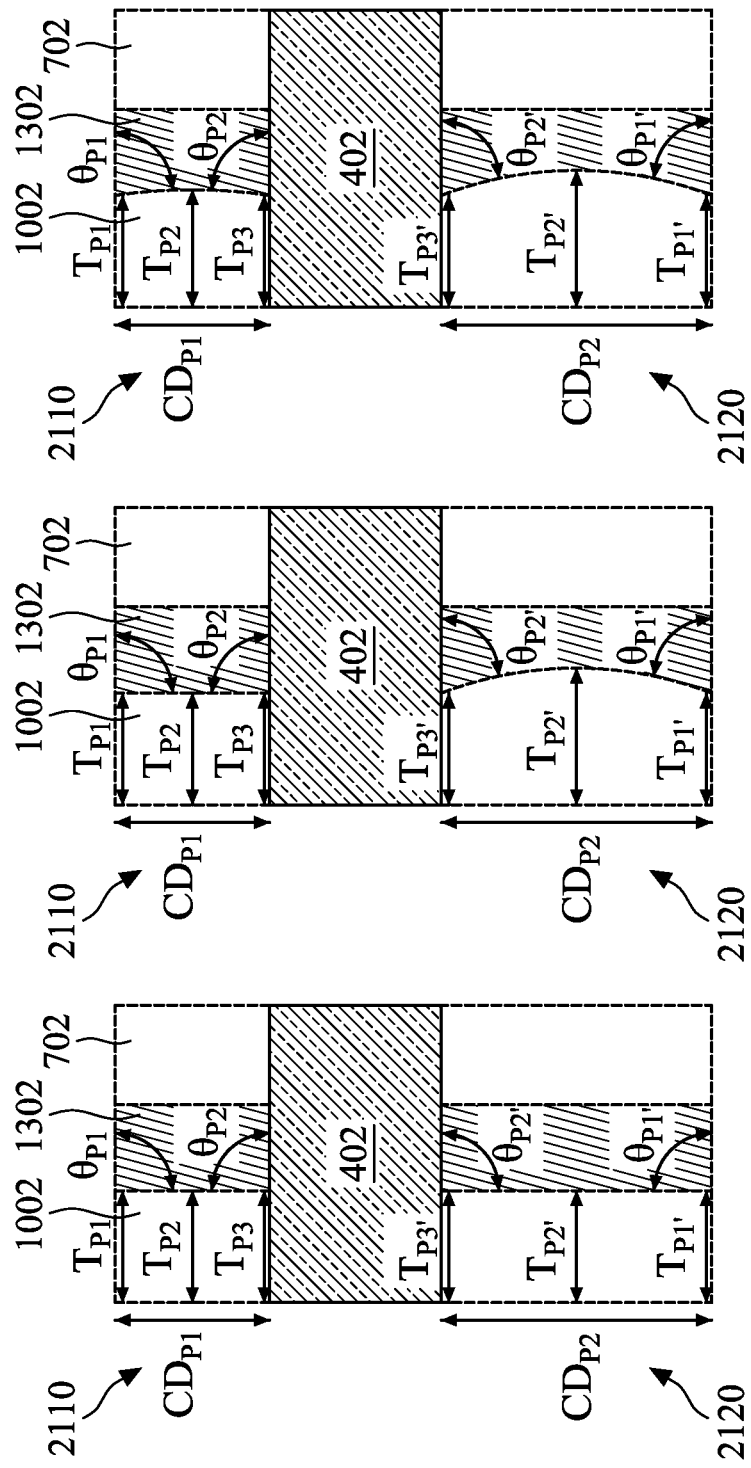

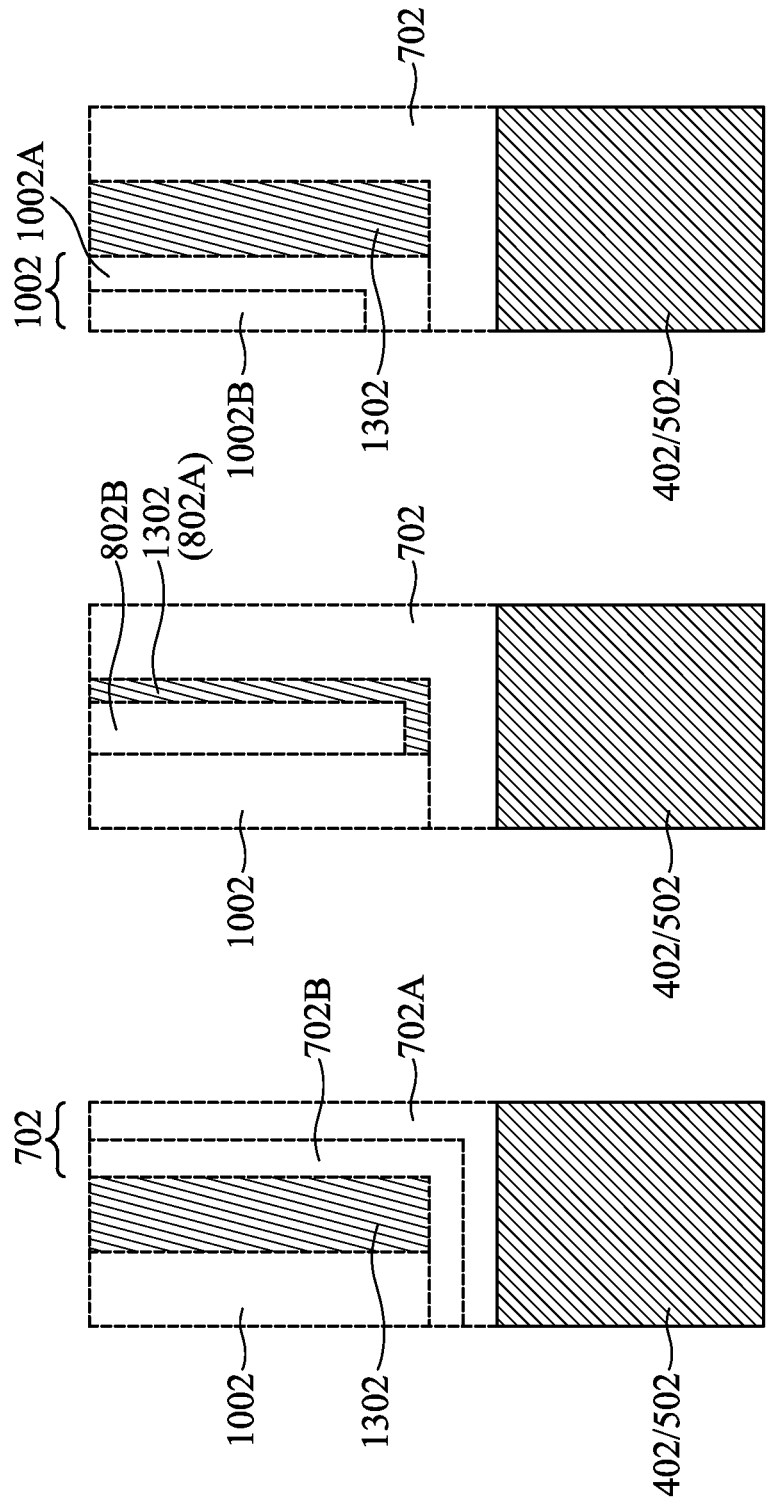

SEMICONDUCTOR DEVICES AND METHODS OF MANUFACTURING THEREOF

CROSS-REFERENCE TO RELATED APPLICATION

This application claims priority to and the benefit of U.S. Provisional Application No. 63/166,625, filed Mar. 26, 2021, entitled "AIR SPACER FORMATION WITH INTERRUPTION SPACER FOR SOURCE DRAIN DAMAGE REDUCTION," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11, 12, and 13 illustrate perspective views of an example non-planar transistor device (or a portion of the example non-planar transistor device) during various fabrication stages, made by the method of FIG. 2, in accordance with some embodiments.

FIGS. 14A-B, 15A-B, 16A-B, 17A-B, 18A-B, and 19A-B illustrate cross-sectional views of various embodiments of the example non-planar transistor device, made by the method of FIG. 2, in accordance with some embodiments.

FIGS. 20A, 20B, 20C, 20D, 20E, 21A, 21B, 21C, and 21D illustrate cross-sectional views of various embodiments of the example non-planar transistor device, made by the method of FIG. 2, in accordance with some embodiments.

FIGS. 22A, 22B, and 22C illustrate cross-sectional views of various embodiments of the example non-planar transistor device, made by the method of FIG. 2, in accordance with some embodiments.

DETAILED DESCRIPTION

Figure 1:
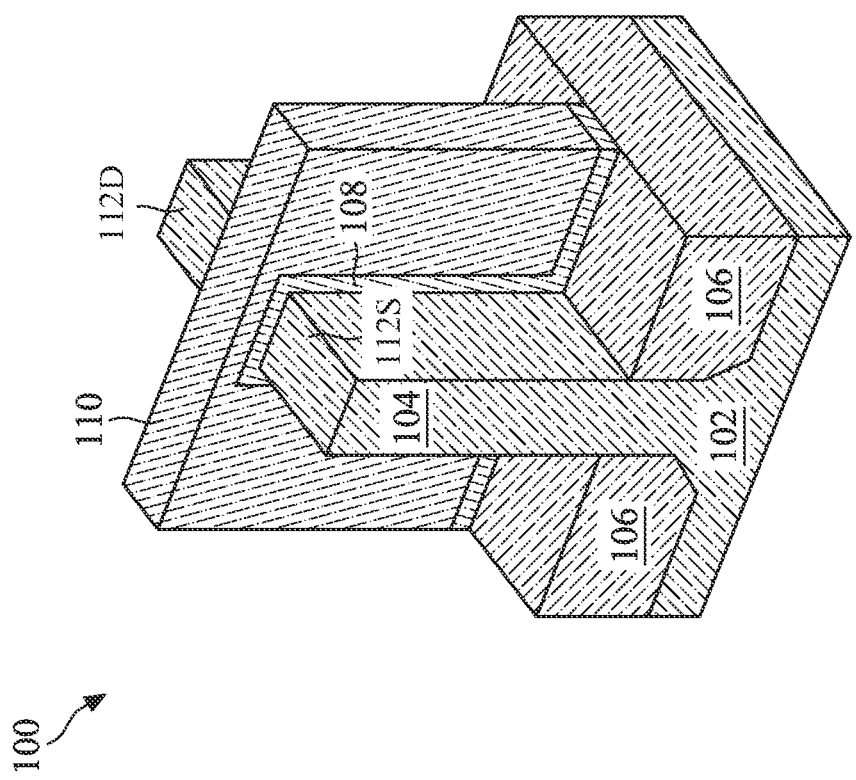
FIG. 1 illustrates a perspective view of an example FinFET device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As integrated circuits continue to decrease in size, limitations in processing capabilities and in fundamental material characteristics have made scaling of planar transistors increasingly difficult (e.g., due to leakage current and process variations). Non-planar transistors such as, for example, fin-based field effect transistors (FinFETs), gate-all-around field effect transistors (GAA FETs), etc., have been proposed as a promising alternative to the planar transistors. In recent years, advances in processing technology have made such non-planar transistors a viable option in emerging technology nodes.

In general, a FinFET includes a three-dimensional fin of semiconducting material that extends between source and drain regions/structures. A gate structure is disposed over the fin of semiconducting material. Often the FinFET further includes gate spacers disposed along sidewalls of the gate structure. The gate spacers are typically made of an electrically insulating material that can define a lateral space between the gate structure and the source/drain structures.

As the size of integrated circuit components continues to shrink, the parasitic capacitance through such gate spacers has become an increasing contributor to the total parasitic capacitance of the FinFET. For example, gate spacers disposed around a gate structure of a FinFET have a dielectric constant that increases parasitic capacitances between the gate structure and the source/drain structure and/or between the gate structure and the contacts corresponding to the source/drain structure. The parasitic capacitance disadvantageously degrades the performance of the FinFET by inducing an RC time delay.

In this regard, the concept to replace a portion of the gate spacer with a material having a lower dielectric constant has been proposed. For example, a middle portion of the gate spacer may be removed, thereby forming an air gap between the gate structure and the source/drain structure, which can advantageously reduce the parasitic capacitance (in turn, reducing the RC time delay). However, such a removed portion may be disposed between the gate structure and the source/drain structure. Thus, when being removed (e.g., by etchants), the etchants can penetrate through a side portion of the gate spacer and damage the source/drain structure, which can again disadvantageously degrade the performance of the FinFET.

Embodiments of the present disclosure are discussed in the context of forming non-planar transistor devices (e.g., FinFET devices, nanostructure transistor devices), and in particular, in the context of forming a gate spacer that has an air gap. For example, following the formation of a dummy gate structure over a portion of a partially formed channel structure (e.g., a fin structure, a stack of sacrificial layers and channel layers, etc.), bottom gate spacers are formed on opposite sides of the dummy gate structure. Next, sacrificial gate spacers are formed over the bottom gate spacers, and then patterned to remove their respective laterally extending portions. Next, top gate spacers are formed over the sacrificial gate spacers. As such, when removing the sacrificial gate spacers with etchants to form air gaps, the etchants to source/drain structures can be significantly blocked by the top gate spacers (and thus sometimes referred to as "protection gate spacers" or "interruption gate spacers"), which can advantageously reduce the damage to the source/drain structures.

FIG. 1 illustrates a perspective view of an example FinFET device 100, in accordance with various embodiments. The FinFET device 100 includes a substrate 102 and a fin 104 protruding from the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. It should be appreciated that FIG. 1 is provided as a simplified reference to illustrate a number of feature of a FinFET device, and thus, the FinFET device 100 can include one or more additional features not shown in FIG. 1. For example, the FinFET device 100 can include a number of pairs of gate spacers disposed on opposite sides of the gate 110, which will be discussed in further detail below.

Figure 2:
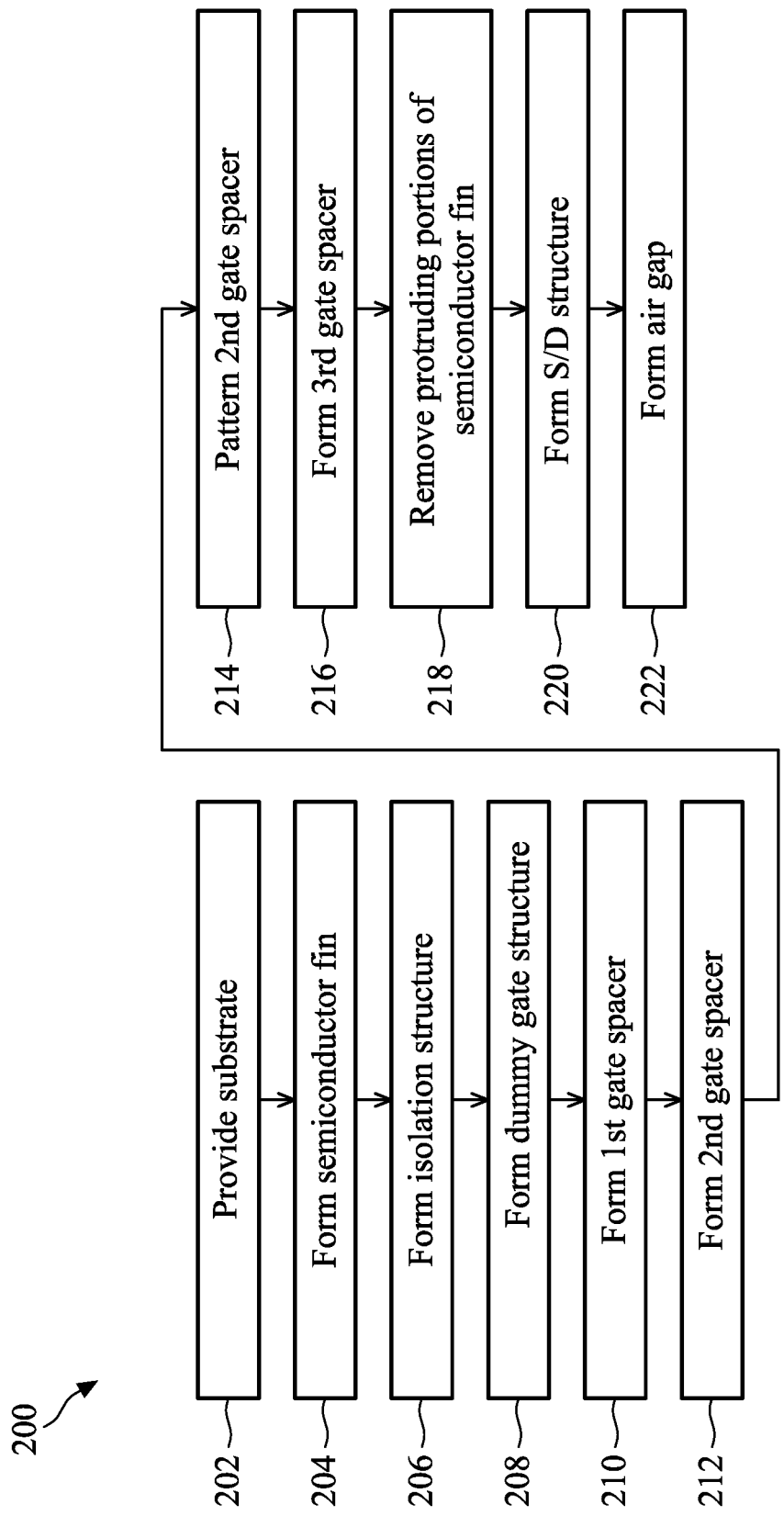
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., semiconductor device 100). However, it should be understood that the method 200 can be used to form a nanostructure transistor (e.g. nanosheet transistor device, a nanowire transistor device, gate-all-around (GAA) transistor device, multi-bridge channel transistor), a vertical transistor device, or the like, while remaining within the scope of the present disclosure. It is noted that the method 200 is merely an example, and is not intended to limit the present disclosure. Accordingly, it is understood that additional operations may be provided before, during, and after the method 200 of FIG. 2, and that some other operations may only be briefly described herein.

In some embodiments, operations of the method 200 may be associated with perspective views of an example non-planar transistor device 300 at various fabrication stages as shown in FIGS. 3, 4, 5, 6, 7, 8, 9, 10, 11, 12, and 13, respectively, which will be discussed in further detail below.

In brief overview, the method 200 starts with operation 202 of providing a substrate. The method 200 continues to operation 204 of forming a semiconductor fin. The method 200 continues to operation 206 of forming an isolation structure. The method 200 continues to operation 208 of forming a dummy gate structure. The method 200 continues to operation 210 of forming a first gate spacer. The method 200 continues to operation 212 of forming a second gate spacer. The method 200 continues to operation 214 of patterning the second gate spacer. The method 200 continues to operation 216 of forming a third gate spacer. The method 200 continues to operation 218 of removing protruding portions of the semiconductor fin. The method 200 continues to operation 220 of growing source/drain structures. The method 200 continues to operation 222 of forming an air gap.

Corresponding to operation 202 of FIG. 2, FIG. 3 is a perspective view of the non-planar transistor device 300 including a semiconductor substrate 302 at one of the various stages of fabrication, in accordance with various embodiments.

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layer or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
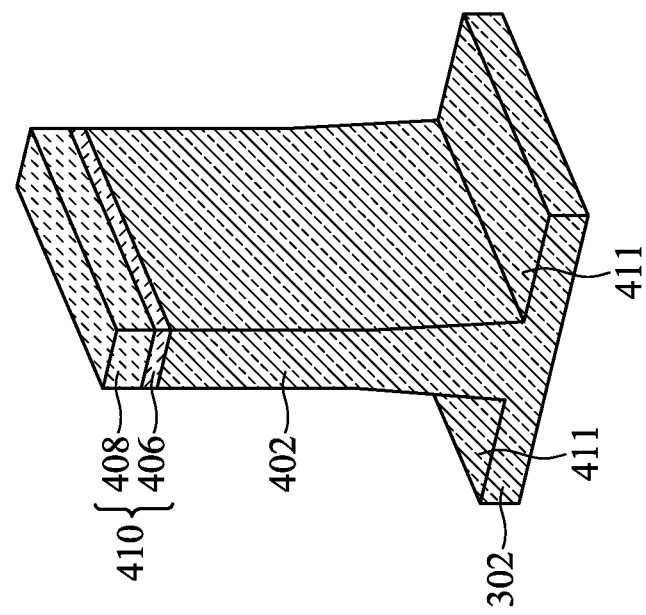

Corresponding to operation 204 of FIG. 2, FIG. 4 is a perspective view of the non-planar transistor device 300 including a semiconductor fin 402 at one of the various stages of fabrication, in accordance with various embodiments. As shown, the semiconductor fin 402 has a lengthwise direction extending along a first lateral direction, e.g., the Y axis.

The semiconductor fin 402 is formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the semiconductor fin 402 between adjacent trenches 411 as illustrated in FIG. 4. When multiple fins are formed, such a trench may be disposed between any adjacent ones of the fins. In some embodiments, the semiconductor fin 402 is formed by etching trenches in the substrate 302 using, for example, reactive ion etch (ME), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the semiconductor fin 402.

WA The semiconductor fin 402 may be patterned by any suitable method. For example, the semiconductor fin 402 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3-4 illustrate an embodiment of forming the semiconductor fin 402, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the semiconductor fin 402 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more semiconductor fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more semiconductor fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fin 402 may include silicon germanium ($Si_xGe_{1-x}$, where x can be between 0 and 1), silicon carbide, pure silicon, pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
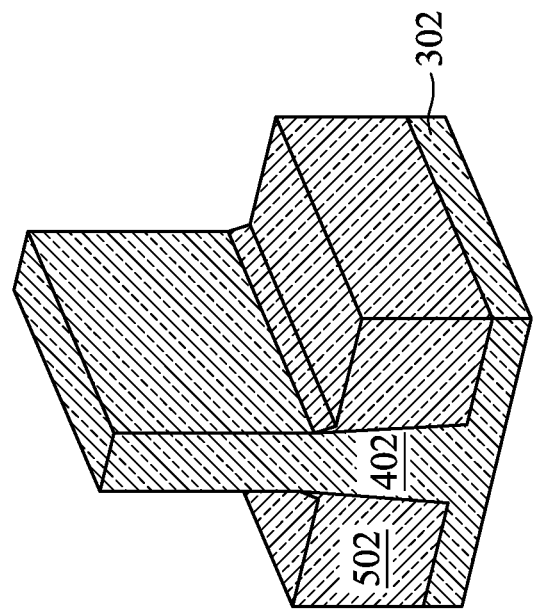

Corresponding to operation 206 of FIG. 2, FIG. 5 is a perspective view of the non-planar transistor device 300 including an isolation region/structure 502 at one of the various stages of fabrication, in accordance with various embodiments.

The isolation structure 502, which is formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material to form top surfaces of the isolation structure 502 and top surfaces of the semiconductor fin 402 as a coplanar surface. The patterned mask 410 (FIG. 4) may also be removed by the planarization process.

In some embodiments, the isolation structure 502 includes a liner, e.g., a liner oxide (not shown), at the interface between the isolation structure 502 and the substrate 302 (semiconductor fin 402). In some embodiments, the liner oxide is formed to reduce crystalline defects at the interface between the substrate 302 and the isolation structure 502. Similarly, the liner oxide may also be used to reduce crystalline defects at the interface between the semiconductor fin 402 and the isolation structure 502. The liner oxide (e.g., silicon oxide) may be a thermal oxide formed through a thermal oxidation of a surface layer of the substrate 302, although other suitable method may also be used to form the liner oxide.

Figure 6:
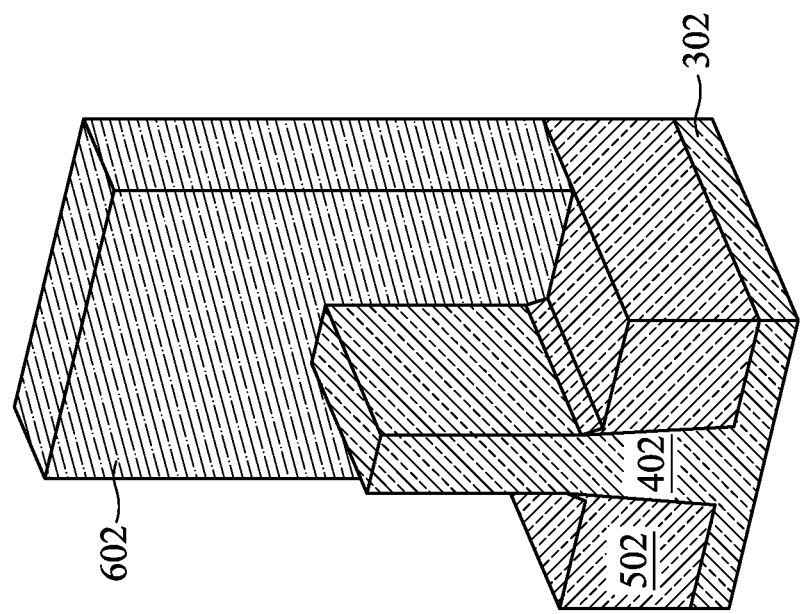

Corresponding to operation 208 of FIG. 2, FIG. 6 is a perspective view of the non-planar transistor device 300 including a dummy gate structure 602 at one of the various stages of fabrication, in accordance with various embodiments. As shown, the dummy gate structure 602 has a lengthwise direction extending along a second lateral direction perpendicular to the lengthwise direction of the semiconductor fin 402, e.g., the X axis. It should be noted that, for purposes of clarity, only a half of the non-planar transistor device 300 (e.g., a half of the semiconductor fin 402 that is disposed on one side of the dummy gate structure 602) is shown in FIG. 6.

The dummy gate structure 602 may include a dummy gate dielectric and a dummy gate electrode, which are not shown separately in the present disclosure. In some embodiments, at least a major portion of the dummy gate structure 602 (e.g., the dummy gate electrode) will be removed in a later removal (e.g., etching) process to form a metal (or otherwise active) gate structure. The dummy gate dielectric and the dummy gate electrode may be formed by performing at least some of the following processes. A dielectric layer (used to form the dummy gate dielectric) is formed over the semiconductor fin 402. The dielectric layer may be, for example, silicon oxide, silicon nitride, multilayers thereof, or the like, and may be deposited or thermally grown.

Next, a gate layer (used to form the dummy gate electrode) is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using acceptable photolithography and etching techniques to form a mask. The pattern of the mask may be transferred to the gate layer and the dielectric layer by an acceptable etching technique to form the dummy gate structure 602.

Figure 7:
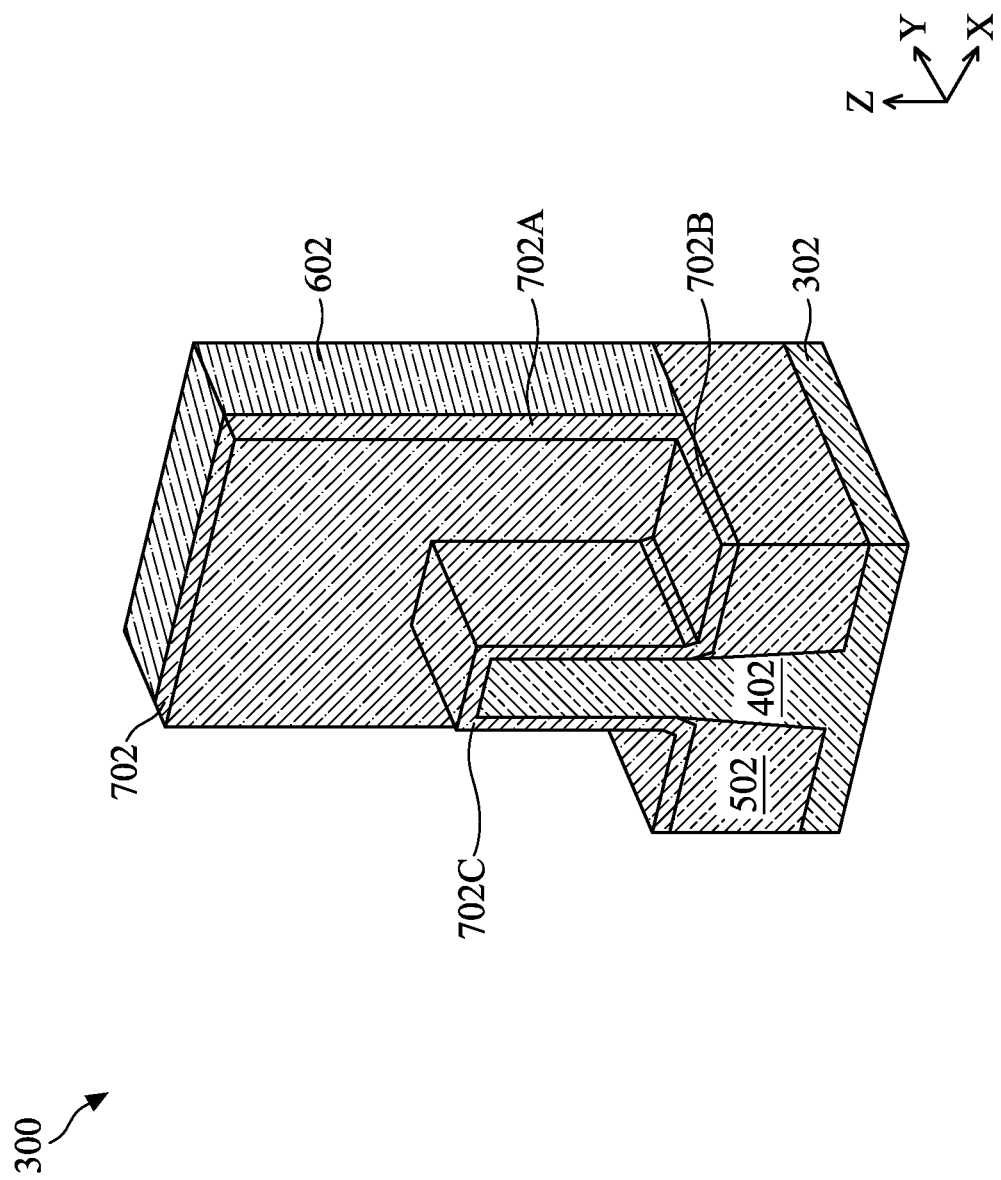

Corresponding to operation 210 of FIG. 2, FIG. 7 is a perspective view of the non-planar transistor device 300 including a first gate spacer (or bottom gate spacer) 702 at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 7. Thus, on the other side of the dummy gate structure 602 (along the Y axis), the non-planar transistor device 300 can include another bottom gate spacer 702.

The bottom gate spacer 702 is formed along one of the sidewalls of the dummy gate structure 602 to overlay a (e.g., remaining) portion of the semiconductor fin 402 that is not overlaid by the dummy gate structure 602. In accordance with various embodiments, the bottom gate spacer 702 is formed as a relatively thin layer, as illustrated in FIG. 7. As such, in addition to extending along a sidewall of the dummy gate structure 602, the bottom gate spacer 702 straddles the remaining portion of the semiconductor fin 402 and overlays a major (e.g., top) surface of the isolation structure 502. Some portion of the bottom gate spacer 702 can be formed in an L-shaped profile. For example, the portion of the bottom gate spacer 702 vertically extending along the sidewall of the dummy gate structure 602 (hereinafter "vertical portion 702A") and the portion laterally extending and overlaying the isolation structure 502 (hereinafter "lateral portion 702B") can present an L-shaped profile. The portion that straddles the fin structure 402, which will be later removed, may sometimes be referred to as "straddling portion 702C."

To form the bottom gate spacer 702, an insulation material may be conformally deposited over the workpiece. The insulation material may include a silicon-based dielectric material such as, for example, silicon oxide (SiO), silicon nitride (SiN), silicon carbide (SiC), silicon carbide nitride (SiCN), silicon oxycarbonitride (SiOCN), silicon oxynitride (SiON), silicon oxycarbide (SiOC), silicoboron carbonitride (SiBCN), silicoboron oxycarbonitride (SiBOCN), or combinations thereof. In some other embodiments, the insulation material may include a metal-based dielectric material such as, for example, hafnium oxide (HfO), aluminium oxide ($Al_2O_3$), copper oxide (CuO), titanium nitride (TiN), or combinations thereof.

The insulation material may be deposited by a high density plasma chemical vapor deposition (HDP-CVD), a flowable CVD (FCVD), atomic layer deposition (ALD), epitaxial deposition, plasma-enhanced chemical vapor deposition (PECVD), plasma-enhanced atomic layer deposition (PEALD), or combinations thereof. Other insulation materials and/or other formation processes may be used, while remaining within the scope of the present disclosure.

Figure 8:
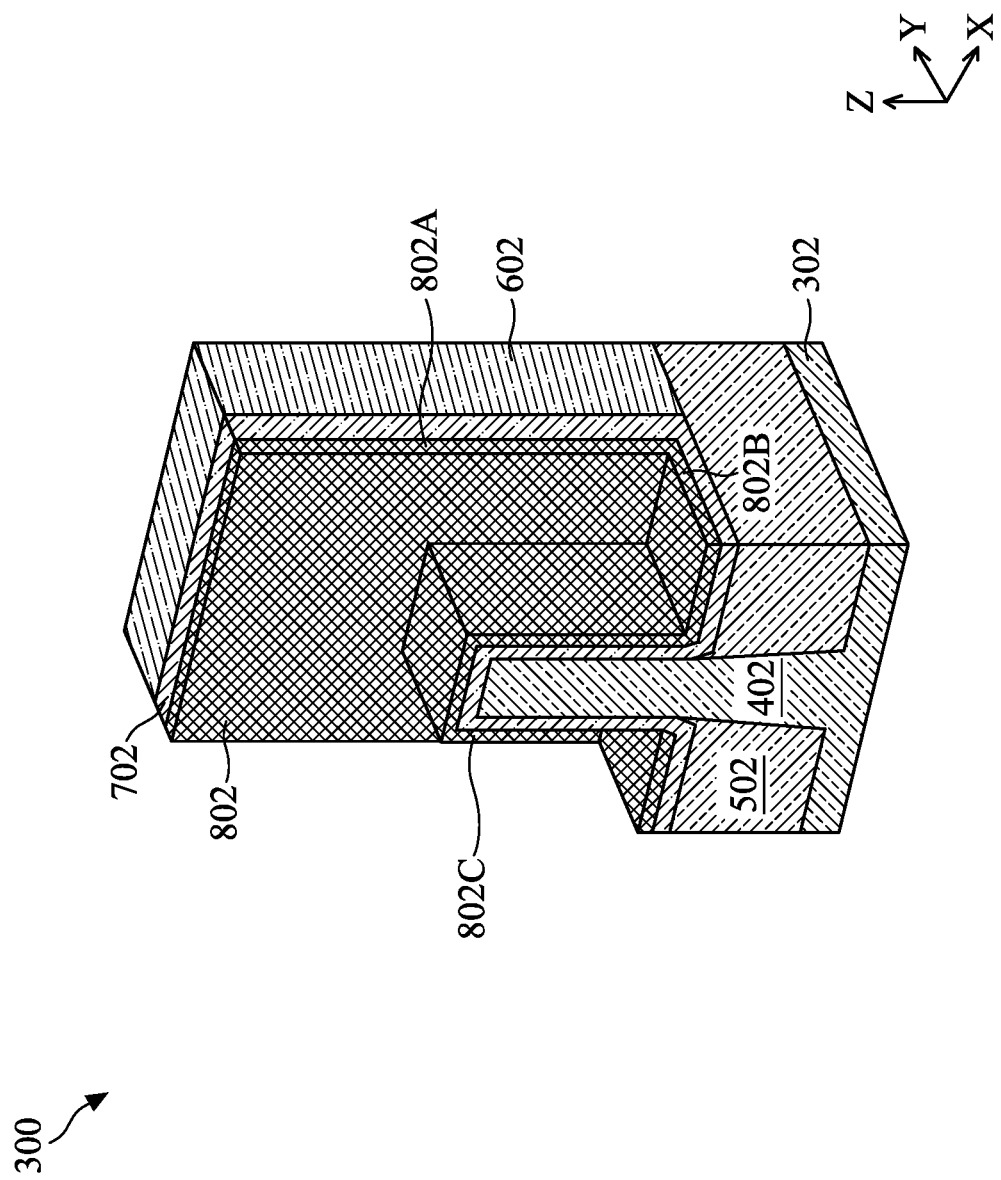

Corresponding to operation 212 of FIG. 2, FIG. 8 is a perspective view of the non-planar transistor device 300 including a second gate spacer (or sacrificial gate spacer) 802 at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 8. Thus, on the other side of the dummy gate structure 602 (along the Y axis), the non-planar transistor device 300 can include another sacrificial gate spacer 802.

In some embodiments, the sacrificial gate spacer 802 may be (e.g., conformally) formed as a relatively thin layer, which allows some portion of the sacrificial gate spacer 802 to follow the L-shaped profile of the bottom gate spacer 702. For example in FIG. 8, the sacrificial gate spacer 802 can have a vertically extending portion 802A (hereinafter "vertical portion 802A") and a laterally extending portion 802B (hereinafter "lateral portion 802B") that contact the vertical portion 702A and lateral portion 702B, respectively, to collectively form an L-shaped profile. Similar as the bottom gate spacer 702, the sacrificial gate spacer 802 also has a straddling portion 802C that contacts the straddling portion 702C. According to various embodiments, prior to being overlaid by a top gate spacer, the sacrificial gate spacer 802 can be patterned to remove the straddling portion 802C together with the lateral portion 802B. As such, when etching the sacrificial gate spacer to form an air gap, a passage of the etchant can be blocked by the top gate spacer, which can advantageously prevent a later formed source/drain structure from being damaged by the etchant.

To form the sacrificial gate spacer 802, an insulation material may be deposited over the workpiece. The insulation material may include a silicon-based dielectric material such as, for example, silicon oxide (SiO), silicon nitride (SiN), silicon carbide (SiC), silicon carbide nitride (SiCN), silicon oxycarbonitride (SiOCN), silicon oxynitride (SiON), silicon oxycarbide (SiOC), silicoboron carbonitride (SiBCN), silicoboron oxycarbonitride (SiBOCN), or combinations thereof. In some other embodiments, the insulation material may include a metal-based dielectric material such as, for example, hafnium oxide (HfO), aluminium oxide ($Al_2O_3$), copper oxide (CuO), titanium nitride (TiN), or combinations thereof.

The insulation material may be deposited by a high density plasma chemical vapor deposition (HDP-CVD), a flowable CVD (FCVD), atomic layer deposition (ALD), epitaxial deposition, plasma-enhanced chemical vapor deposition (PECVD), plasma-enhanced atomic layer deposition (PEALD), or combinations thereof. Other insulation materials and/or other formation processes may be used, while remaining within the scope of the present disclosure.

Figure 9:
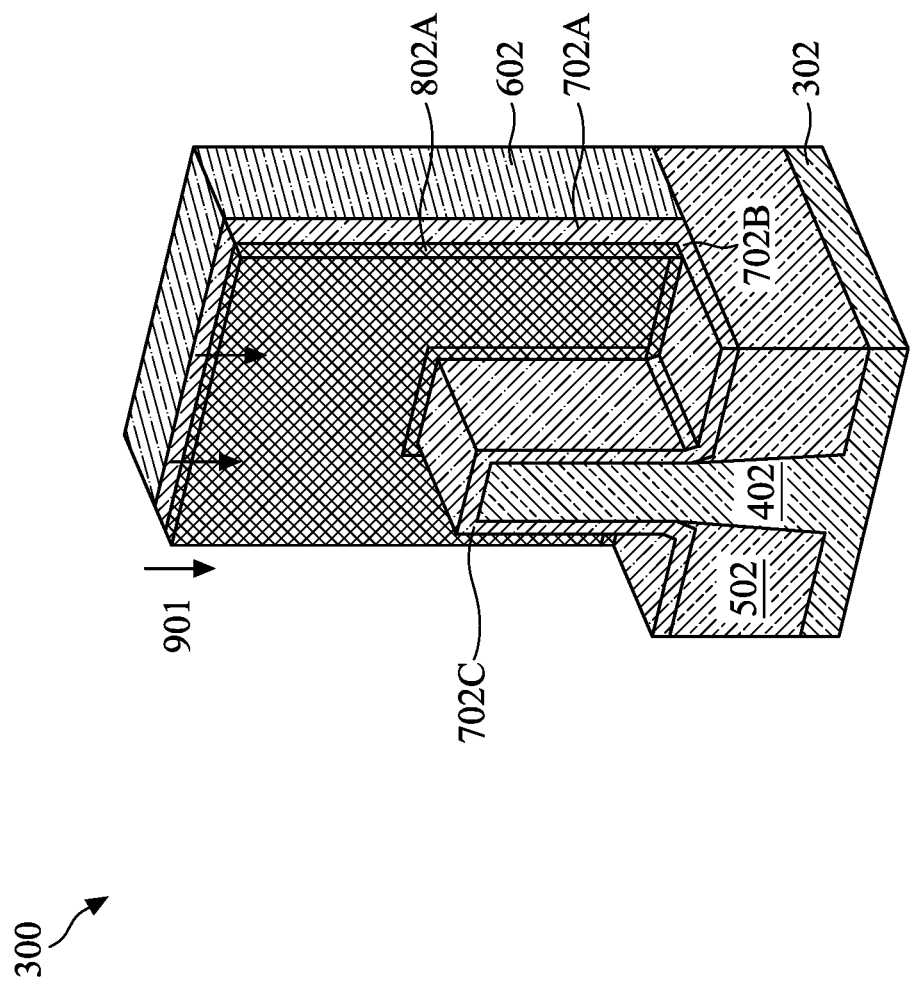

Corresponding to operation 214 of FIG. 2, FIG. 9 is a perspective view of the non-planar transistor device 300 in which the sacrificial gate spacer 802 is patterned at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 9. Thus, on the other side of the dummy gate structure 602 (along the Y axis), the non-planar transistor device 300 can include another patterned sacrificial gate spacer 802.

An etching process 901 can be performed to pattern the sacrificial gate spacer 802. The etching process 901 may be directional (e.g., anisotropic) to cause the straddling portion 802C and lateral portion 802B (FIG. 8) to be removed. As such, upon performing the etching process 901, only the vertical portion 802A remains, which exposes the straddling portion 702C and lateral portion 702B. Such a re-exposed layer (e.g., gate spacer 702) may sometimes be referred to as an exposed layer. By patterning the sacrificial gate spacer to extend only along the sidewall of the dummy gate structure 602, such a patterned sacrificial gate spacer (hereinafter "802A") can be "terminated" by one or more later formed upper (e.g., top) gate spacers. Accordingly, when removing the sacrificial gate spacer to form an air gap, an active device structure (e.g., a source/drain structure) formed opposite the top gate spacer from the air gap can prevent from being attacked by a corresponding etchant of the removal process.

In accordance with some embodiments, the etching process 901 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof. The plasma source power may be between 100 watts (W) and 3000 W. The plasma bias power may be between 0 W and 3000 W. The pressure may be between 1 mTorr and 800 mTorr. The flow rate may be between 1 standard cubic centimeters per minute (sccm) and 5000 sccm. For a wet clean etch (e.g., following the plasma etching process), the main etch chemical may include at least one of HF, $F_2$, or $H_3PO_4$, for example. An assisted etch chemical for selectivity tuning may include at least one of $O_3$, $H_2SO_4$, HCl, HBr, or $NH_3$. A solvent for the wet etch may include at least one of DI water, alcohol, or acetone.

Additionally, the etching process 901 may have an etching selectivity between the materials of the bottom gate spacer 702 and sacrificial gate spacer 802. The materials of the bottom gate spacer 702 and sacrificial gate spacer 802 may be different or have different compositions to allow the etching process 901 to present a high enough etching selectivity (e.g., greater than 5×) between the bottom gate spacer 702 and sacrificial gate spacer 802. For example, the sacrificial gate spacer 802 may have an oxide-based material (e.g., SiO) and the bottom gate spacer 702 may have a nitride-based dielectric material (e.g., SiN). In another example, the sacrificial gate spacer 802 may have a nitride-based material (e.g., SiN) and the bottom gate spacer 702 may have an oxide-based dielectric material (e.g., SiO). In yet another example, the bottom gate spacer 702 and sacrificial gate spacer 802 may be both formed of SiCN, but the bottom gate spacer 702 includes a higher concentration of carbon, compared to a lower carbon concentration contained in the sacrificial gate spacer 802.

Figure 10:
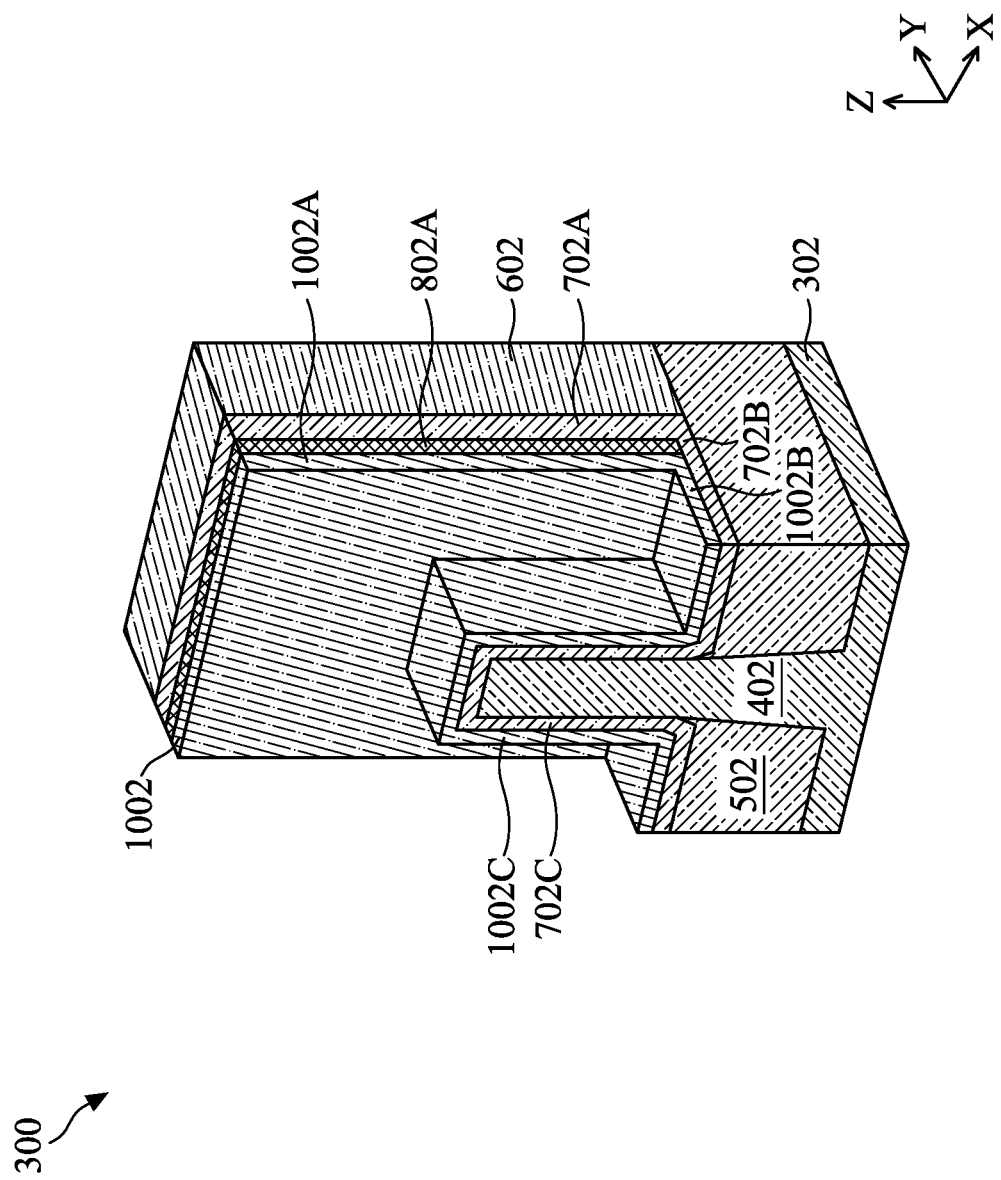

Corresponding to operation 216 of FIG. 2, FIG. 10 is a perspective view of the non-planar transistor device 300 including a third gate spacer (or top gate spacer) 1002 at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 10. Thus, on the other side of the dummy gate structure 602 (along the Y axis), the non-planar transistor device 300 can include another top gate spacer 1002.

In some embodiments, the top gate spacer 1002 may be (e.g., conformally) formed as a relatively thin layer, which allows the top gate spacer 1002 to form in an L-shaped profile just like the bottom gate spacer 702 and pre-patterned sacrificial gate spacer 802. For example in FIG. 10, the top gate spacer 1002 can have a vertically extending portion (hereinafter "vertical portion 1002A"), and a laterally extending portion (hereinafter "lateral portion 1002B") to collectively form the L-shaped profile. Similarly, the top gate spacer 1002 also has a straddling portion 1002C. Specifically, the vertical portion 1002A is in contact with a sidewall of the vertical portion 802A to terminal its lateral extension toward an extending portion of the semiconductor fin 402 (i.e., away from the gate structure 602); the lateral portion 1002B is in contact with the exposed lateral portion 702B; and the straddling portion 1002C is in contact with the straddling portion 702C.

To form the top gate spacer 1002, an insulation material may be deposited over the workpiece. The insulation material may include a silicon-based dielectric material such as, for example, silicon oxide (SiO), silicon nitride (SiN), silicon carbide (SiC), silicon carbide nitride (SiCN), silicon oxycarbonitride (SiOCN), silicon oxynitride (SiON), silicon oxycarbide (SiOC), silicoboron carbonitride (SiBCN), silicoboron oxycarbonitride (SiBOCN), or combinations thereof. In some other embodiments, the insulation material may include a metal-based dielectric material such as, for example, hafnium oxide (HfO), aluminium oxide ($Al_2O_3$), copper oxide (CuO), titanium nitride (TiN), or combinations thereof.

According to various embodiments of the present disclosure, the material of the sacrificial gate spacer 802 is different from the material of the bottom and top gate spacers, 702 and 1002, thereby having a high etching selectivity that etches the patterned sacrificial gate spacer 802A at a substantially higher rate (e.g., greater than 5×) than the bottom and top gate spacers, 702 and 1002. Alternatively, the bottom, patterned sacrificial, and top gate spacers, 702, 802A, and 1002, may be formed of a similar material, but with different compositions. For example, the sacrificial gate spacer 802 may have an oxide-based material (e.g., SiO), and the bottom and top gate spacers, 702 and 1002, may have a nitride-based dielectric material (e.g., SiN). In another example, the sacrificial gate spacer 802 may have a nitride-based material (e.g., SiN), and the bottom and top gate spacers, 702 and 1002, may have an oxide-based dielectric material (e.g., SiO). In yet another example, the bottom, sacrificial, and top gate spacers may all be formed of SiCN, but the bottom and top gate spacers include a higher concentration of carbon, compared to a lower carbon concentration contained in the sacrificial gate spacer. As such, when removing the patterned sacrificial gate spacer to form an air gap, the bottom and top gate spacers may remain substantially intact to sandwich the air gap therebetween.

The insulation material may be deposited by a high density plasma chemical vapor deposition (HDP-CVD), a flowable CVD (FCVD), atomic layer deposition (ALD), epitaxial deposition, plasma-enhanced chemical vapor deposition (PECVD), plasma-enhanced atomic layer deposition (PEALD), or combinations thereof. Other insulation materials and/or other formation processes may be used, while remaining within the scope of the present disclosure.

Figure 11:
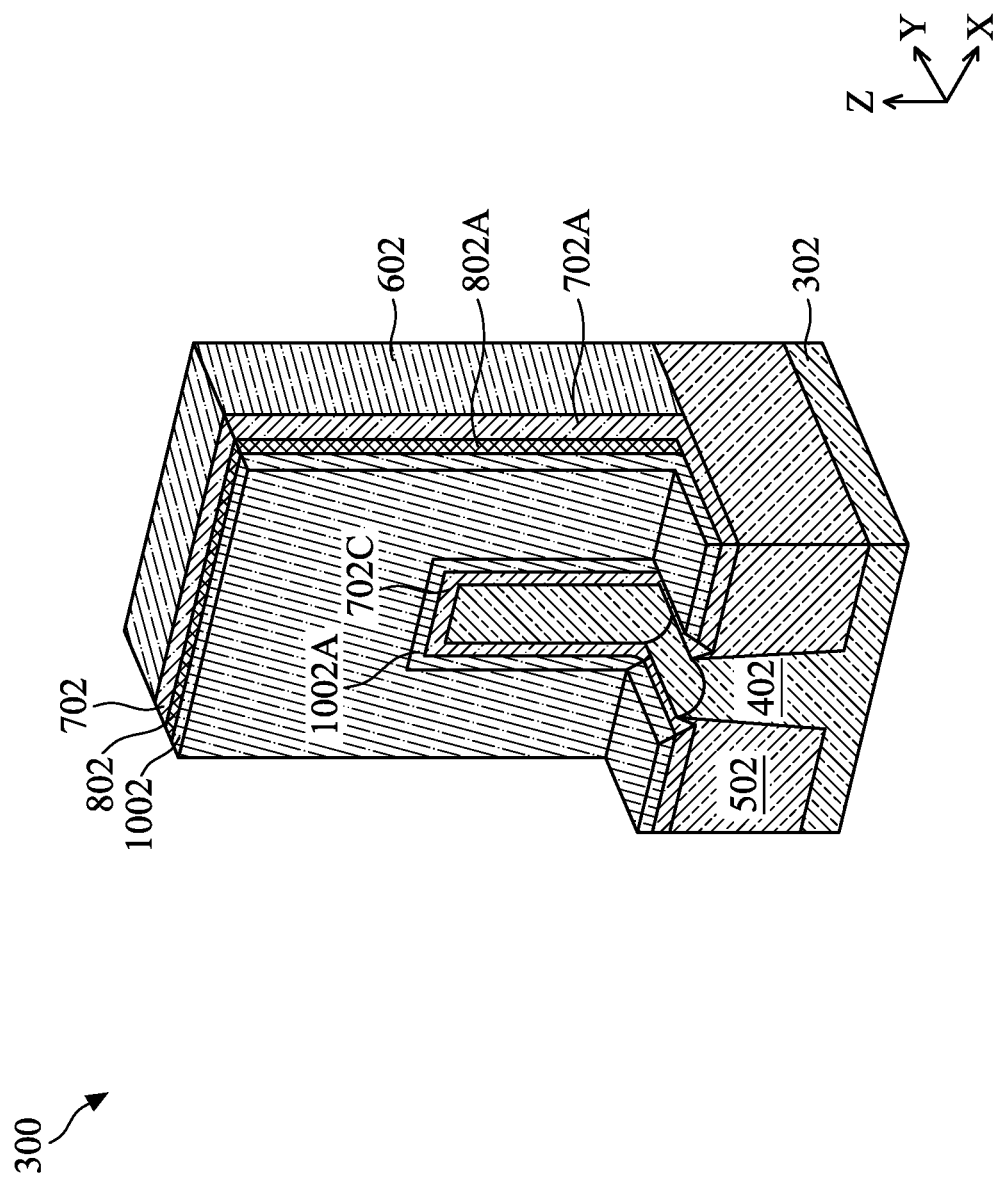

Corresponding to operation 218 of FIG. 2, FIG. 11 is a perspective view of the non-planar transistor device 300 in which a portion of the semiconductor fin 402 that protrudes from the vertical portion 1002A is removed at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 11. Thus, another portion of the semiconductor fin 402 on the other side of the dummy gate structure 602 (along the Y axis) is also removed.

In some embodiments, an anisotropic etching process may be performed to remove the protruding portion of the semiconductor fin 402. The etching process may collectively or respectively remove the following portions of the workpiece: the straddling portion 1002C of the top gate spacer 1002 (FIG. 10), a majority portion of the straddling portion 702C of the bottom gate spacer 702 (FIG. 10), and the protruding portion of the semiconductor fin 402. As such, a sidewall of a (e.g., remaining) portion of the semiconductor fin 402 that is overlaid by the dummy gate structure 602 and gate spacers 702, 802, and 1002 can be exposed, as shown in FIG. 11. It should be appreciated that the remaining portion of the semiconductor fin 402 is still straddled by the dummy gate structure 602, the bottom gate spacer 702 (e.g., the vertical portion 702A and the remaining straddling portion 702C), the patterned sacrificial gate spacer 802A, and the top gate spacer 1002 (e.g., the vertical portion 1002A), with the patterned sacrificial gate spacer 802A unexposed by, for example, the vertical portion 1002A.

Figure 12:
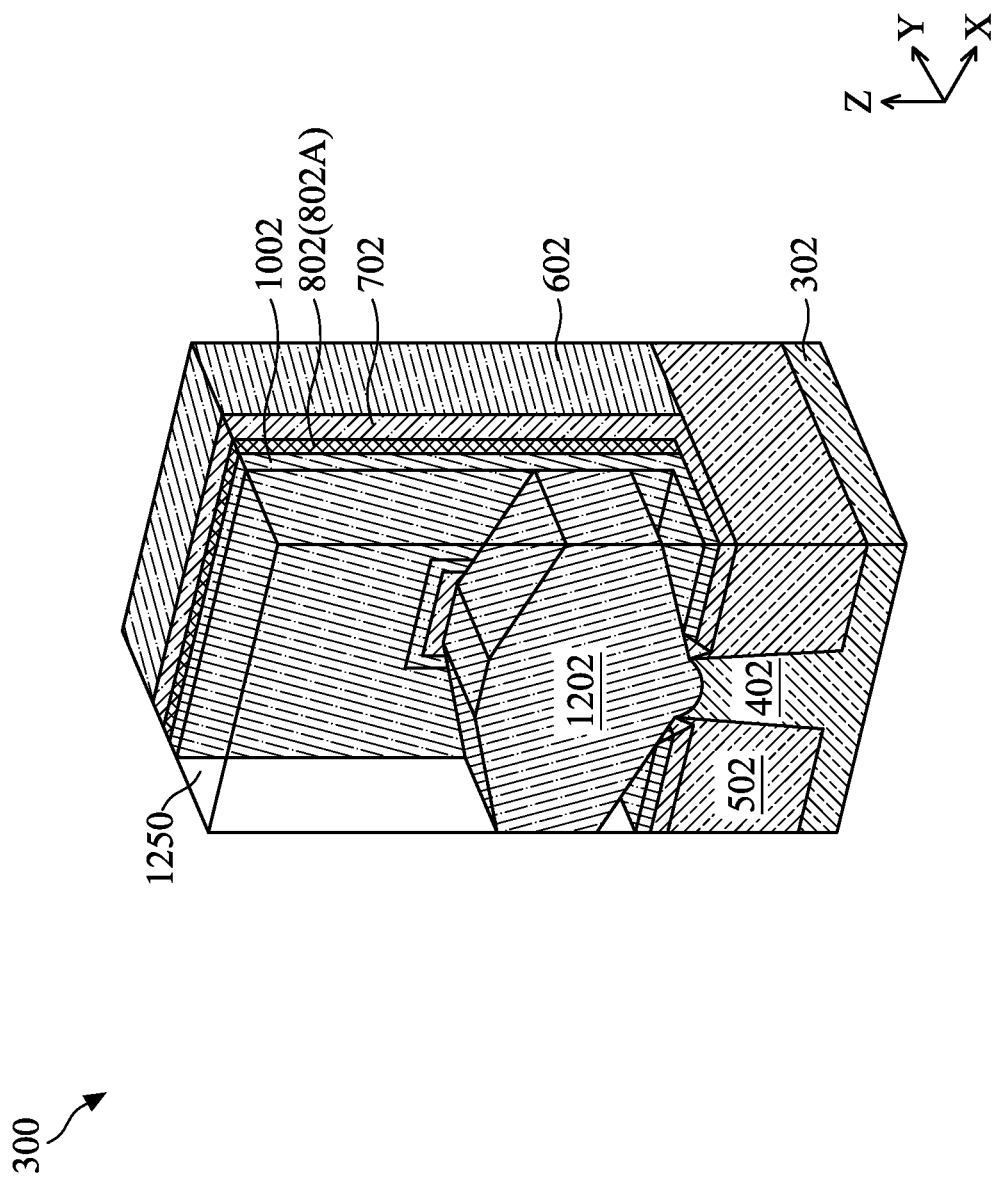

Corresponding to operation 220 of FIG. 2, FIG. 12 is a perspective view of the non-planar transistor device 300 including a source/drain structure 1202 at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 12. Thus, on the other side of the dummy gate structure 602 (along the Y axis), the non-planar transistor device 300 can include another source/drain structure 1202.

The source/drain structure 1202 is formed by epitaxially growing a semiconductor material from the exposed sidewalls of the semiconductor fin 402 (FIG. 11). Thus, the source/drain structure 1202 is extended from (e.g., physically connected to) one end of the overlaid portion of the semiconductor fin 402, which functions as the conduction channel of the non-planar transistor device 300. Various suitable methods can be used to epitaxially grow the source/drain structure 1202 such as, for example, metal-organic CVD (MOCVD), molecular beam epitaxy (MBE), liquid phase epitaxy (LPE), vapor phase epitaxy (VPE), selective epitaxial growth (SEG), the like, or combinations thereof.

In some embodiments, when the resulting non-planar transistor device 300 is an n-type transistor, the source/drain structure 1202 may include silicon carbide (SiC), silicon phosphorous (SiP), phosphorous-doped silicon carbon (SiCP), or the like. When the resulting non-planar transistor device 300 is a p-type transistor, the source/drain structure 1202 may include SiGe, and a p-type impurity such as boron or indium.

The source/drain structure 1202 may be implanted with dopants to form the source/drain structure 1202, followed by an anneal process. The implanting process may include forming and patterning masks such as a photoresist to cover the regions of the non-planar transistor device 300 that are to be protected from the implanting process. The source/drain structure 1202 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain structure 1202 of a P-type transistor. N-type impurities, such as phosphorous or arsenide, may be implanted in the source/drain structure 1202 of an N-type transistor. In some embodiments, the epitaxial source/drain regions may be in situ doped during growth.

Following the formation of the source/drain structure(s) 1202, an interlayer dielectric (ILD) 1250 is formed to overlay the source/drain structure(s) 1202. In some embodiments, the ILD 1250 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, a planarization process, such as a CMP process, may be performed to achieve a level (e.g., coplanar) top surface for the ILD 1250, top gate spacer 1002, sacrificial gate spacer 802, bottom gate spacer 702, and dummy gate structure 602, as shown in FIG. 12.

Figure 13:
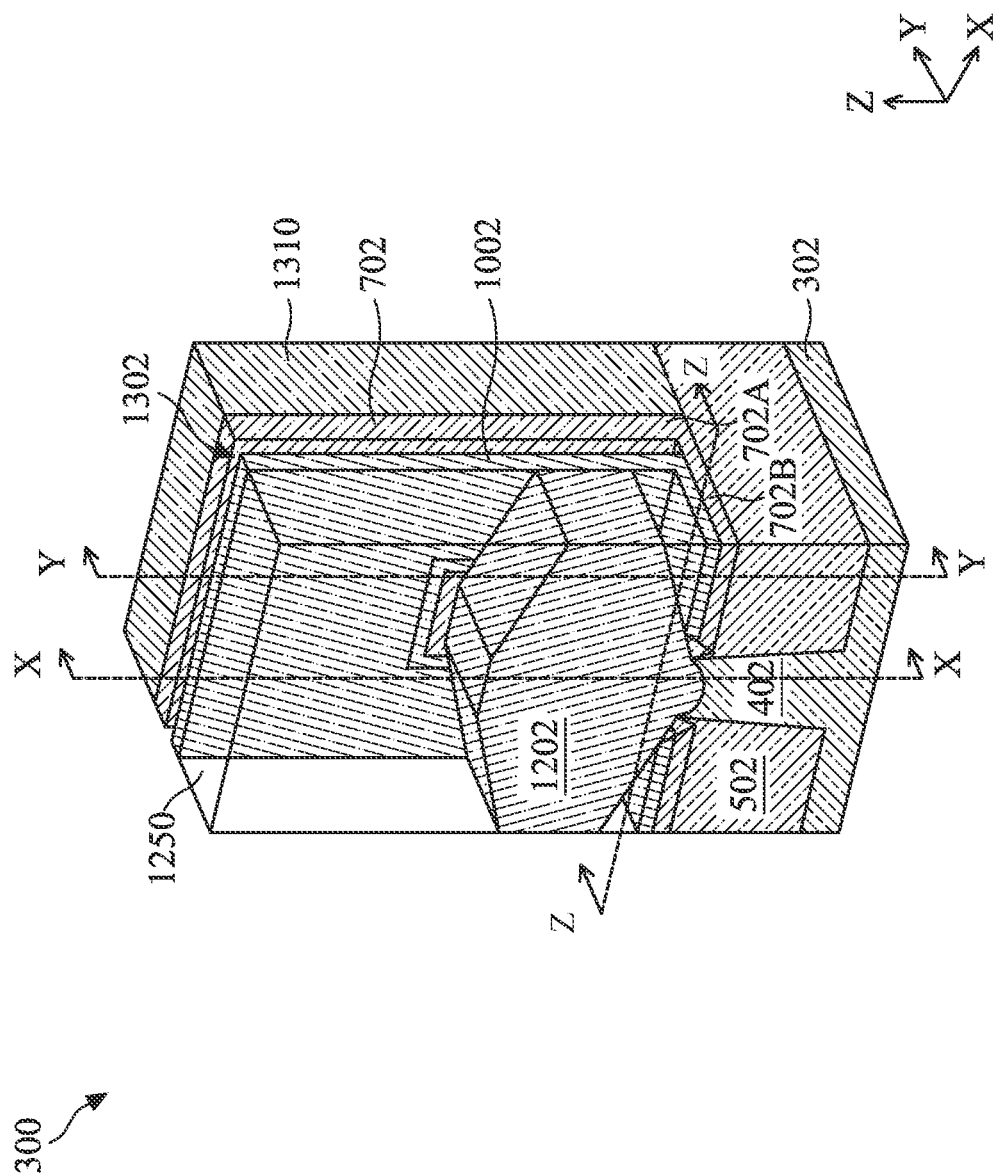

Corresponding to operation 222 of FIG. 2, FIG. 13 is a perspective view of the non-planar transistor device 300 including an air gap 1302 at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 13. Thus, on the other side of the dummy gate structure 602 (along the Y axis), the non-planar transistor device 300 can include another air gap 1302.

In some embodiments, the air gap 1302 can be formed by selectively etching the patterned sacrificial gate spacer 802A (FIG. 12), while leaving the bottom gate spacer 702 and the top gate spacer 1002 substantially intact. The etching process can include a plasma ashing process (e.g., when the patterned sacrificial gate spacer 802A includes carbon), a wet etching process, or combinations thereof. For example, when the bottom gate spacer 702 and top gate spacer 1002 are formed of SiOCN, the (patterned) sacrificial gate spacer 802/802A is formed of SiN, the etching process may include an etchant of $H_3PO_4$. However, it should be understood that the etching process can include any of various etchants that has an etching selectivity between the bottom gate spacer 702 and the patterned sacrificial gate spacer 802A and between the top gate spacer 1002 and the patterned sacrificial gate spacer 802A, while remaining within the scope of the present disclosure.

As such, the air gap 1302 can inherit the vertically extending profile of the patterned sacrificial gate spacer 802A. Specifically, the air gap 1302 can be formed to have a first portion (e.g., a virtual sidewall) exposing a sidewall of the vertical portion 702A and a bottom end (e.g., a virtual bottom surface) exposing a major surface of the lateral portion 702B. In some other embodiments, after the removal process of the patterned sacrificial gate spacer 802A, a portion of the patterned sacrificial gate spacer 802A may still remain, which cause the lateral portion 702B to remain unexposed.

The air gap 1302 may include air or other gases, including gases present during deposition of the insulation material of the sacrificial gate spacer 802, such as oxygen, nitrogen, argon, hydrogen, helium, xenon, as well as mixtures thereof. A gas pressure within the air gap 1302 may be atmospheric pressure. Alternatively, the gas pressure within the air gap 1302 may be greater than or less than the atmospheric pressure.

Next, the dummy gate structure 602 (FIG. 12) is replaced with an active (e.g., metal) gate structure 1310. The metal gate structure 1310 can include a gate dielectric layer, a metal gate layer, and one or more other layers. For example, the metal gate structure 1310 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer is formed in a corresponding gate trench to straddle a portion of the semiconductor fin 402 (e.g., a channel structure of the non-planar transistor device 300). In an embodiment, the gate dielectric layer can be the remaining portion of a dummy gate dielectric of the dummy gate structure. In another embodiment, the gate dielectric layer can be formed by removing the dummy gate dielectric, followed by conformal deposition or thermal reaction. In yet another embodiment, the gate dielectric layer can be formed by removing the dummy gate dielectric, followed by no further processing step (i.e., the gate dielectric layer may be a native oxide).

The gate dielectric layer includes silicon oxide, silicon nitride, or multilayers thereof. In example embodiments, the gate dielectric layer includes a high-k dielectric material, and in these embodiments, the gate dielectric layer may have a k value greater than about 7.0, and may include a metal oxide or a silicate of Hf, Al, Zr, La, Mg, Ba, Ti, Pb, or combinations thereof. The formation methods of gate dielectric layer may include molecular beam deposition (MBD), atomic layer deposition (ALD), PECVD, and the like. A thickness of the gate dielectric layer may be between about 8 angstroms (Å) and about 20 Å, as an example.

The metal gate layer is formed over the gate dielectric layer. The metal gate layer may be a P-type work function layer, an N-type work function layer, multi-layers thereof, or combinations thereof, in some embodiments. Accordingly, the metal gate layer is sometimes referred to as a work function layer. For example, the metal gate layer may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

Although each of the bottom/sacrificial/top gate spacers discussed above (e.g., 702, 802, 1002) is formed as a single layer, it should be understood that any of the gate spacers can be formed as a multi-layer stack, while remaining within the scope of the present disclosure. In such embodiments, one or more layers of any of the gate spacers (e.g., a gate spacer other than the sacrificial gate spacer) can be replaced with an air gap. Further, more than one air gap can be formed. Still further, such multiple air gaps can be disconnected from each other. According to various embodiments of the present disclosure, by "patterning" an upper gate spacer to be replaced with an air gap, a lower gate spacer that is disposed below the upper gate spacer is partially exposed. Such a lower gate spacer may sometimes be referred to as an etch stop layer. It should also be noted that the lower gate spacer may not be a layer next lower than the upper gate spacer, which will be discussed in further detail below.

In an example where there are two (first and second) gate spacers being formed and each of the first and second gate spacers are formed as a single layer, either a semiconductor fin/isolation structure or the first gate spacer, both disposed below (e.g., overlaid by) the second gate spacer, can serve as an etch stop layer, while patterning the second gate spacer. In such a scenario, the air gap can only be formed by replacing the second gate spacer. Alternatively stated, there is one instance in terms of where (e.g., which of the gate spacers) the air gap can be formed.

In another example where there are three (first, second, and third) gate spacers being formed and each of the first through third gate spacers are formed as a single layer, a semiconductor fin/isolation structure, the first gate spacer, or the second gate spacer, all disposed below (e.g., overlaid by) the third gate spacer, can serve as an etch stop layer, while patterning the third gate spacer. In such a scenario, the air gap can be formed by replacing the second gate spacer, the third gate spacer, or both of the second and third gate spacers (where two air gaps connected to each other). Alternatively stated, there are three instances in terms of where (e.g., which of the gate spacers) the air gap can be formed, which is summarized in Table I below. In Table I, each row represents an "instance" where one or more air gaps (represented as "AG") can be formed by replacing one or more corresponding gate spacers, and each instance is associated with which of the layers serves as the etch stop layer.

TABLE 1

| Instance | Semiconductor fin/ isolation structure ($0^{th}$ layer) | $1^{st}$ gate spacer ($1^{th}$ layer) | $2^{nd}$ gate spacer ($2^{nd}$ layer) | $3^{rd}$ gate spacer ($3^{rd}$ layer) | Etch stop layer |
|---|---|---|---|---|---|
| 1 | | | AG | | $0^{th}$ layer or $1^{st}$ gate spacer |
| 2 | | | | AG | $0^{th}$ layer, $1^{st}$ gate spacer, or $2^{nd}$ gate spacer |
| 3 | | | AG | AG | $0^{th}$ layer or $1^{st}$ gate spacer |

Using the semiconductor fin 402/isolation structure 502, gate spacers 702, 802, and 1002 (to represent the $0^{th}$, $1^{st}$, $2^{nd}$, and $3^{rd}$ layers, respectively) as an illustration example, it may be better appreciated to read such a table. For example in instance #1, while patterning the sacrificial gate spacer 802 ($2^{nd}$ layer) to later form an air gap, either the bottom gate spacer 702 ($1^{st}$ layer) or the semiconductor fin 402/isolation structure 502 ($0^{th}$ layer) may be exposed. For example in instance #2, while patterning the top gate spacer 1002 ($3^{rd}$ layer) to later form an air gap, the sacrificial gate spacer 802 ($2^{nd}$ layer), the bottom gate spacer 702 ($1^{st}$ layer), or the semiconductor fin 402/isolation structure 502 ($0^{th}$ layer) may be exposed. For example in instance #3, while patterning the sacrificial gate spacer 802 ($2^{nd}$ layer) and top gate spacer ($3^{rd}$ layer) to later form air gaps connected with each other, either the bottom gate spacer 702 ($1^{st}$ layer) or the semiconductor fin 402/isolation structure 502 ($0^{st}$ layer) may be exposed.

In yet another example where there are four (first, second, third, and fourth) gate spacers being formed and each of the first through fourth gate spacers are formed as a single layer, a semiconductor fin/isolation structure, the first gate spacer, the second gate spacer, or the third gate spacer, all disposed below (e.g., overlaid by) the fourth gate spacer, can serve as an etch stop layer, while patterning the fourth gate spacer. In such a scenario, the air gap can be formed by replacing the second gate spacer' the third gate spacer, the fourth gate spacer, both of the second and third gate spacers (where two air gaps connected to each other), the second and fourth gate spacers (where two air gap disconnected from each other), both of the third and fourth gate spacers (where two air gaps connected to each other), or the second through fourth gate spacers (where three air gap connected to each other). Alternatively stated, there are seven instances in terms of where (e.g., which of the gate spacers) the air gap can be formed, which is summarized in Table II below. In Table II, each row represents an "instance" where one or more air gaps (represented as "AG") can be formed by replacing one or more corresponding gate spacers, and each instance is associated with which of the layers serves as the etch stop layer.

TABLE II

| Instance | Semi-conductor fin/ isolation structure ($0^{th}$ layer) | $1^{st}$ gate spacer ($1^{th}$ layer) | $2^{nd}$ gate spacer ($2^{nd}$ layer) | $3^{rd}$ gate spacer ($3^{rd}$ layer) | $4^{th}$ gate spacer ($4^{th}$ layer) | Etch stop layer |
|---|---|---|---|---|---|---|
| 1 | | | AG | | | $0^{th}$ layer or $1^{st}$ gate spacer |
| 2 | | | | AG | | $0^{th}$ layer, $1^{st}$ gate spacer, or $2^{nd}$ gate spacer |
| 3 | | | | | AG | $0^{th}$ layer, $1^{st}$ gate spacer, $2^{nd}$ gate spacer, or $3^{rd}$ gate spacer |
| 4 | | | AG | AG | | $0^{th}$ layer or $1^{st}$ gate spacer |
| 5 | | | AG | | AG | $0^{th}$ layer or $1^{st}$ gate spacer |
| 6 | | | | AG | AG | $0^{th}$ layer, $1^{st}$ gate spacer, or $2^{nd}$ gate spacer |
| 7 | | | AG | AG | AG | $0^{th}$ layer or $1^{st}$ gate spacer |

FIGS. 14A-B, 15A-B, 16A-B, 17A-B, 18A-B, and 19A-B illustrate cross-sectional views of various embodiments of the non-planar transistor device 300 discussed above. The cross-sectional views of non-planar transistor device 300 in FIGS. 14A, 15A, 16A, 17A, 18A, and 19A are cut along cross-section X-X (as indicated in FIG. 13). The cross-section X-X extends along the lengthwise direction of the semiconductor fin 402 (but does no not extend over the source/drain structure 1202). The cross-sectional views of non-planar transistor device 300 in FIGS. 14B, 15B, 16B, 17B, 18B, and 19B are cut along cross-section Y-Y (as indicated in FIG. 13). The cross-section Y-Y, in parallel with the cross-section X-X, extends across the isolation structure 502 (but does no not extend over the source/drain structure 1202).

In the example of FIGS. 14A-B, the bottom gate spacer 702, which is formed as a single layer, serves as an etch stop layer when patterning the sacrificial gate spacer 802 (e.g., FIG. 9). As shown in both FIGS. 14A and 14B, upon forming the air gap 1302 (by removing the sacrificial gate spacer 802), the bottom gate spacer 702 can present one or more L-shaped profiles that each have a lateral portion extending below both the air gap 1302 and the top gate spacer 1002 (e.g., along the Y axis). Specifically, one of such L-shaped profiles may present over the semiconductor fin 402 (e.g., FIG. 14A), and another L-shaped profile may present over the isolation structure 502 (e.g., FIG. 14B).

Various critical dimension (CDs) may be used to characterize the features of the disclosed device 300. For example, the thickness of a top portion of the top gate spacer 1002 over the semiconductor fin 402 may be characterized with $T_c$; the thickness of a bottom portion of the top gate spacer 1002 over the semiconductor fin 402 may be characterized with $B_c$; the thickness of a top portion of the top gate spacer 1002 over the isolation structure 502 may be characterized with $T_s$; the thickness of a bottom portion of the top gate spacer 1002 over the isolation structure 502 may be characterized with $B_s$; a bottom corner angle between a sidewall and bottom surface of the air gap 1302 over the semiconductor fin 402 may be characterized with $\theta_c$; and a bottom corner angle between a sidewall and bottom surface of the air gap 1302 over the isolation structure 502 may be characterized with $\theta_s$. As a non-limiting example, $T_c$ is substantially similar to $B_c$ (e.g., with a difference equal to or less than 0.5 nm); $T_s$ is substantially similar to $B_s$ (e.g., with a difference equal to or less than 0.5 nm); $\theta_c$ may be in a range between about 85° and 95°; and $\theta_s$ may be in a range between about 85° and 95°. Depending on various processing conditions (e.g., etching conditions to removing the protruding portions of the fin 402 discussed in FIG. 11), $T_c$, $B_c$, $T_s$, and $B_s$ can each be in a range from about 0.3 nm to about 30 nm.

In the example of FIGS. 15A-B, the bottom gate spacer 702, which is formed as a single layer, serves as an etch stop layer when patterning the sacrificial gate spacer 802 (e.g., FIG. 9). Further, while forming the air gap 1302 (by removing the sacrificial gate spacer 802), a lower portion of the top gate spacer 1002 may also be consumed. As shown in both FIGS. 15A and 15B, upon forming the air gap 1302, the bottom gate spacer 702 can present one or more L-shaped profiles that each have a lateral portion extending below both the air gap 1302 and the top gate spacer 1002 (e.g., along the Y axis). Specifically, one of such L-shaped profiles may present over the semiconductor fin 402 (e.g., FIG. 15A), and another L-shaped profile may present over the isolation structure 502 (e.g., FIG. 15B). The consumption on the lower portion of the top gate spacer 1002 can also laterally extend a lower portion of the air gap 1302 toward the top gate spacer 1002, or the source/drain structure 1202 (FIG. 13).

As a non-limiting example of FIGS. 15A-B, $T_c$ is greater to $B_c$ (e.g., with a difference equal to or greater than 0.5 nm); $T_s$ is greater to $B_s$ (e.g., with a difference equal to or greater than 0.5 nm); $\theta_c$ may be in a range between about 45° and 85°; and $\theta_s$ may be in a range between about 45° and 85°. Depending on various processing conditions (e.g., etching conditions to removing the protruding portions of the fin 402 discussed in FIG. 11), $T_c$, $B_c$, $T_s$, and $B_s$ can each be in a range from about 0.3 nm to about 30 nm.

In the example of FIGS. 16A-B, the bottom gate spacer 702, which is formed as a single layer, serves as an etch stop layer when patterning the sacrificial gate spacer 802 (e.g., FIG. 9). Further, while patterning the sacrificial gate spacer 802, a portion of the bottom gate spacer 702 may also be consumed. As shown in both FIGS. 16A and 16B, upon forming the air gap 1302 (by removing the sacrificial gate spacer 802), the bottom gate spacer 702 can present one or more staircase profiles that each have a first lateral portion extending below the air gap 1302 and a second lateral portion extending below the top gate spacer 1002 (e.g., along the Y axis). Specifically, one of such staircase profiles may present over the semiconductor fin 402 (e.g., FIG. 16A), and another staircase profile may present over the isolation structure 502 (e.g., FIG. 16B).

As a non-limiting example of FIGS. 16A-B, $T_c$ is substantially similar to $B_c$ (e.g., with a difference equal to or less than 0.5 nm); $T_s$ is substantially similar to $B_s$ (e.g., with a difference equal to or less than 0.5 nm); $\theta_c$ may be in a range between about 85° and 95°; and $\theta_s$ may be in a range between about 85° and 95°. Depending on various processing conditions (e.g., etching conditions to removing the protruding portions of the fin 402 discussed in FIG. 11), $T_c$, $B_c$, $T_s$, and $B_s$ can each be in a range from about 0.3 nm to about 30 nm.

In the example of FIGS. 17A-B, the bottom gate spacer 702, which is formed as a single layer, serves as an etch stop layer when patterning the sacrificial gate spacer 802 (e.g., FIG. 9). Further, while patterning the sacrificial gate spacer 802, a portion of the bottom gate spacer 702 may also be consumed; and while forming the air gap 1302 (by removing the sacrificial gate spacer 802), a lower portion of the top gate spacer 1002 may also be consumed. As shown in both FIGS. 17A and 17B, upon forming the air gap 1302, the bottom gate spacer 702 can present one or more staircase profiles that each have a first lateral portion extending below both of the air gap 1302 and top gate spacer 1002, and a second lateral portion extending below the top gate spacer 1002 (e.g., along the Y axis). Specifically, one of such staircase profiles may present over the semiconductor fin 402 (e.g., FIG. 17A), and another staircase profile may present over the isolation structure 502 (e.g., FIG. 17B). The consumption on the lower portion of the top gate spacer 1002 can also laterally extend a lower portion of the air gap 1302 toward the top gate spacer 1002, or the source/drain structure 1202 (FIG. 13).

As a non-limiting example of FIGS. 17A-B, $T_c$ is greater to $B_c$ (e.g., with a difference equal to or greater than 0.5 nm); $T_s$ is greater to $B_s$ (e.g., with a difference equal to or greater than 0.5 nm); $\theta_c$ may be in a range between about 45° and 85°; and $\theta_s$ may be in a range between about 45° and 85°. Depending on various processing conditions (e.g., etching conditions to removing the protruding portions of the fin 402 discussed in FIG. 11), $T_c$, $B_c$, $T_s$, and $B_s$ can each be in a range from about 0.3 nm to about 30 nm.

Figure 18B:
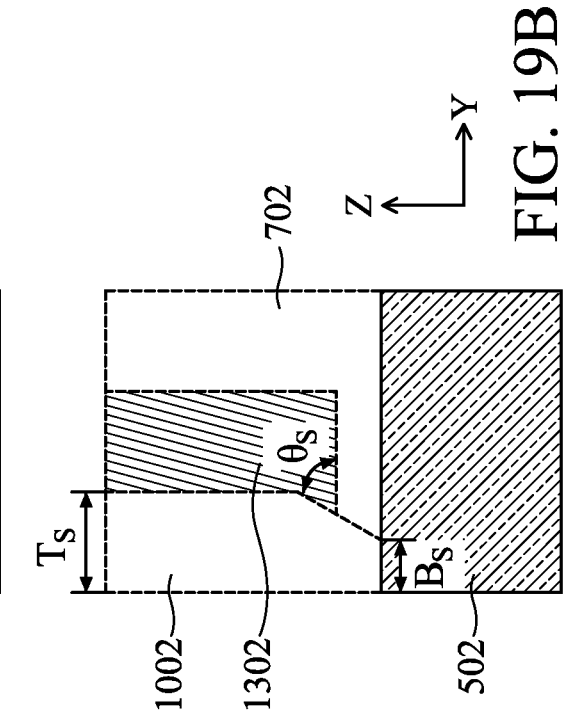
Figure 18A:
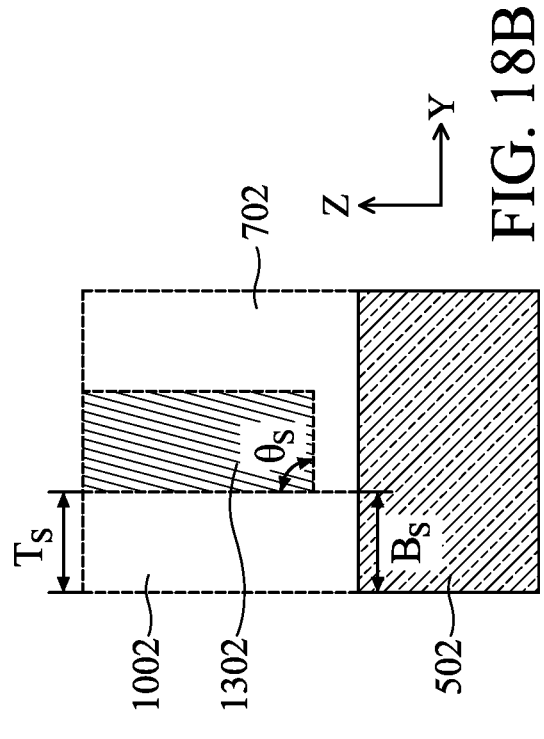

In the example of FIGS. 18A-B, the semiconductor fin 402 and/or the isolation structure 502 serves as an etch stop layer when patterning the sacrificial gate spacer 802 (and also the underlying bottom gate spacer 702). As shown in both FIGS. 18A and 18B, upon forming the air gap 1302 (by removing the sacrificial gate spacer 802), the bottom gate spacer 702 can present one or more L-shaped profiles that each have a lateral portion extending below only the air gap 1302 (e.g., along the Y axis). Specifically, one of such L-shaped profiles may present over the semiconductor fin 402 (e.g., FIG. 18A), and another L-shaped profile may present over the isolation structure 502 (e.g., FIG. 18B).

As a non-limiting example of FIGS. 18A-B, $T_c$ is substantially similar to $B_c$ (e.g., with a difference equal to or less than 0.5 nm); $T_s$ is substantially similar to $B_s$ (e.g., with a difference equal to or less than 0.5 nm); $\theta_c$ may be in a range between about 85° and 95°; and $\theta_s$ may be in a range between about 85° and 95°. Depending on various processing conditions (e.g., etching conditions to removing the protruding portions of the fin 402 discussed in FIG. 11), $T_c$, $B_c$, $T_s$, and $B_s$ can each be in a range from about 0.3 nm to about 30 nm.

Figure 19B:
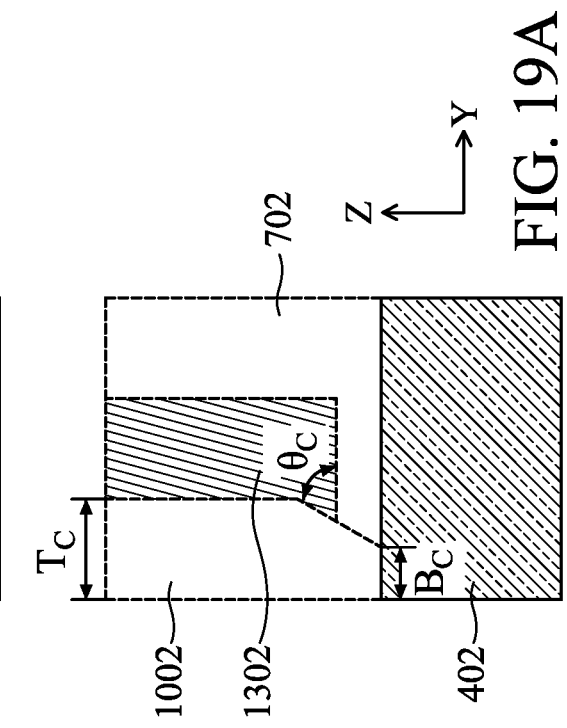
Figure 19A:
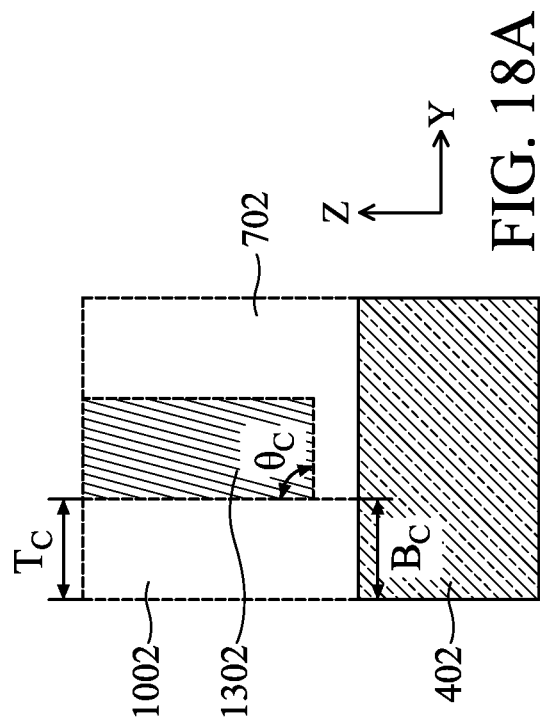

In the example of FIGS. 19A-B, the semiconductor fin 402 and/or the isolation structure 502 serves as an etch stop layer when patterning the sacrificial gate spacer 802 (and also the underlying bottom gate spacer 702). Further, while forming the air gap 1302 (by removing the sacrificial gate spacer 802), a lower portion of the top gate spacer 1002 may also be consumed. As shown in both FIGS. 19A and 19B, upon forming the air gap 1302, the bottom gate spacer 702 can present one or more L-shaped profiles that each have a lateral portion extending below both the air gap 1302 and the top gate spacer 1002 (e.g., along the Y axis). Specifically, one of such L-shaped profiles may present over the semiconductor fin 402 (e.g., FIG. 19A), and another L-shaped profile may present over the isolation structure 502 (e.g., FIG. 19B). The consumption on the lower portion of the top gate spacer 1002 can also laterally extend a lower portion of the air gap 1302 toward the top gate spacer 1002, or the source/drain structure 1202 (FIG. 13).

As a non-limiting example of FIGS. 19A-B, $T_c$ is greater to $B_c$ (e.g., with a difference equal to or greater than 0.5 nm); $T_s$ is greater to $B_s$ (e.g., with a difference equal to or greater than 0.5 nm); $\theta_c$ may be in a range between about 45° and 85°; and $\theta_s$ may be in a range between about 45° and 85°. Depending on various processing conditions (e.g., etching conditions to removing the protruding portions of the fin 402 discussed in FIG. 11), $T_c$, $B_c$, $T_s$, and $B_s$ can each be in a range from about 0.3 nm to about 30 nm.

FIGS. 20A through 20E and FIGS. 21A through 21D illustrate cross-sectional views of various embodiments of the non-planar transistor device 300 discussed above. The cross-sectional views of non-planar transistor device 300 in FIGS. 20A to 21D are cut along cross-section Z-Z (as indicated in FIG. 13). The cross-section Z-Z, perpendicular to the cross-sections X-X and Y-Y, extends along the lengthwise direction of the semiconductor fin 402 (but does not extend over the source/drain structure 1202).

Referring first to FIG. 20A, the air gap 1302 can be formed between the semiconductor fin 402 and a neighboring channel 2002, which may include a dielectric fin or another semiconductor fin that is substantially parallel to the semiconductor fin 402. As shown, the air gap 1302 is disposed in two regions 2010 and 2020 (e.g., along the X axis), respectively. Such two regions 2010 and 2020 are substantially similar to each other, e.g., having the same width extending along the X axis. While FIG. 20A shows that the semiconductor fin 402 has a flat interface in connection with the source/drain structure 1202 (not shown), FIGS. 20B and 20C illustrate other embodiments of the semiconductor fin 402. In FIG. 20B, the semiconductor fin 402 has an interface in connection with the source/drain structure 1202 (not shown) that inwardly protrudes toward the semiconductor fin 402; and in FIG. 20C, the semiconductor fin 402 has an interface in connection with the source/drain structure 1202 (not shown) that outwardly protrudes away from the semiconductor fin 402.

Various CDs may be used to characterize the features of the disclosed device 300. For example in FIG. 20D, the thickness of a farther side portion of the top gate spacer 1002 with respect to the semiconductor fin 402 may be characterized with $T_{p1}$; the thickness of a middle portion of the top gate spacer 1002 with respect to the semiconductor fin 402 may be characterized with $T_{p2}$; the thickness of a closer side portion of the top gate spacer 1002 with respect to the semiconductor fin 402 may be characterized with $T_{p3}$; a corner angle between a sidewall of the air gap 1302 (in contact with the top gate spacer 1002) and a sidewall of the air gap (in contact with the neighboring channel 2002) may be characterized with $\theta_{p1}$; and a corner angle between the sidewall of the air gap 1302 (in contact with the top gate spacer 1002) and a sidewall of the air gap (in contact with the semiconductor fin 402) may be characterized with $\theta_{p2}$.

Figure 20D:
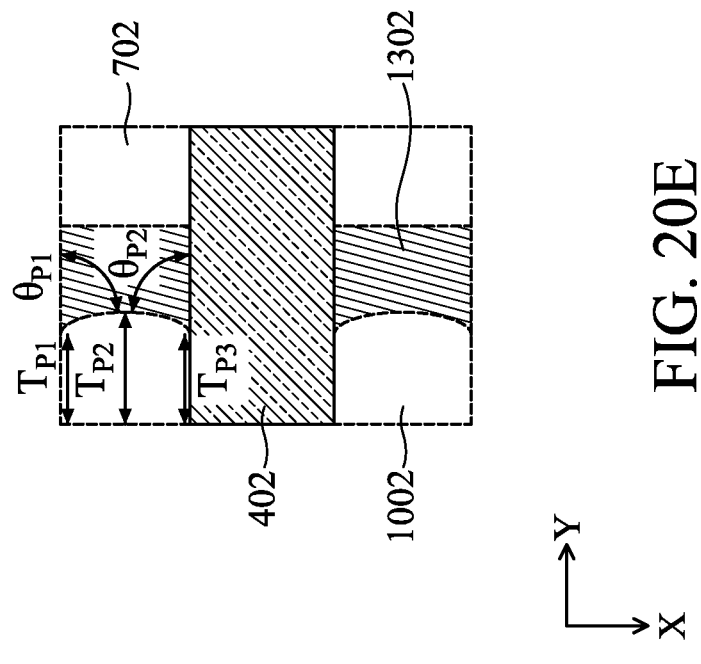
Figure 20E:
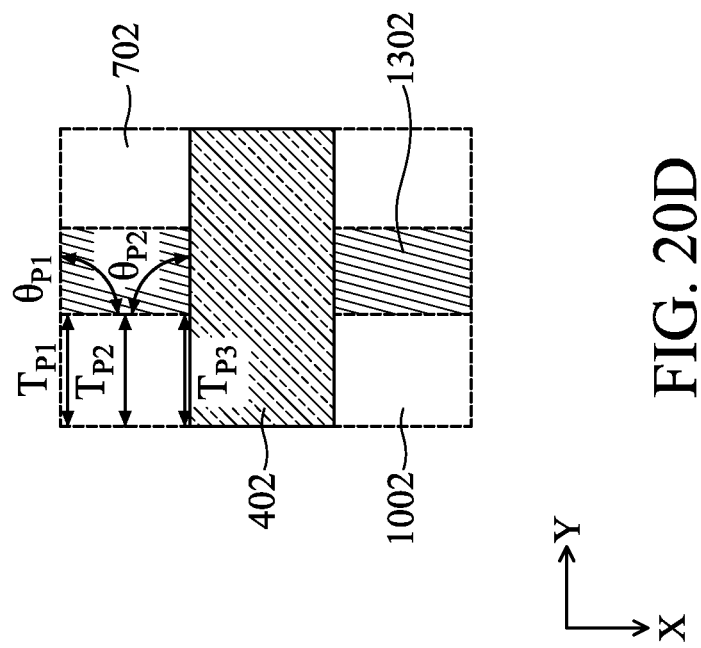

In some embodiments, an interface between the air gap 1302 and the top gate spacer 1002 may be substantially flat, as illustrated in FIG. 20D, or outwardly protrude toward the air gap 1302, as illustrated in FIG. 20E. In the example of FIG. 20D, $T_{p1}$ and $T_{p3}$ are each substantially close to $T_{p2}$ (e.g., with a difference equal to or less than 0.5 nm) by controlling various etching conditions to remove the sacrificial gate spacer 802. For instance, a pulse control etching process (e.g., an atomic layer etching process) may be used. Accordingly, $\theta_{p1}$ and $\theta_{p2}$ may each be in a range of about 85° and about 95°. In the example of FIG. 20E, $T_{p1}$ and $T_{p3}$ are each substantially less than $T_{p2}$ (e.g., with a difference equal to or greater than 0.5 nm). Accordingly, $\theta_{p1}$ and $\theta_{p2}$ may each be in a range of about 30° and about 85°. Depending on various processing conditions (e.g., etching conditions to removing the protruding portions of the fin 402 discussed in FIG. 11), $T_{p1}$, $T_{p2}$, and $T_{p3}$ can each be in a range from about 0.3 nm to about 30 nm.

Figure 21A:
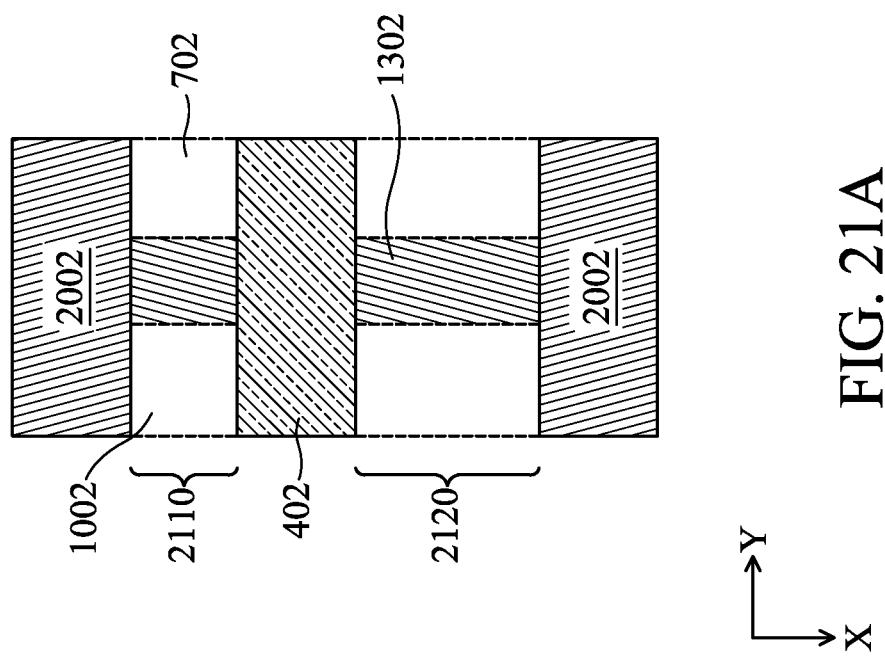

Referring next to FIG. 21A, the air gap 1302 is disposed in two regions 2110 and 2120 (e.g., along the X axis), respectively, one of which has a greater width (extending along the X axis) than the other. Such different widths of the regions 2110 and 2120 can be characterized with $CD_{p1}$ and $CD_{p2}$, respectively, as illustrated in FIG. 21B. As a non-limiting example, a difference between $CD_{p1}$ and $CD_{p2}$ may be equal to or greater than 1 nm. Similarly to the examples shown in FIGS. 20A-E, various CDs can be used to characterize features of the semiconductor device 300, as illustrated in FIGS. 21B-D.

In region 2110, the thickness of a farther side portion of the top gate spacer 1002 with respect to the semiconductor fin 402 may be characterized with $T_{p1}$; the thickness of a middle portion of the top gate spacer 1002 with respect to the semiconductor fin 402 may be characterized with $T_{p2}$; the thickness of a closer side portion of the top gate spacer 1002 with respect to the semiconductor fin 402 may be characterized with $T_{p3}$; a corner angle between a sidewall of the air gap 1302 (in contact with the top gate spacer 1002) and a sidewall of the air gap (in contact with the neighboring channel 2002) may be characterized with $\theta_{p1}$; and a corner angle between the sidewall of the air gap 1302 (in contact with the top gate spacer 1002) and a sidewall of the air gap (in contact with the semiconductor fin 402) may be characterized with $\theta_{p2}$. In region 2120, the thickness of a farther side portion of the top gate spacer 1002 with respect to the semiconductor fin 402 may be characterized with $T_{p1}'$; the thickness of a middle portion of the top gate spacer 1002 with respect to the semiconductor fin 402 may be characterized with $T_{p2}'$; the thickness of a closer side portion of the top gate spacer 1002 with respect to the semiconductor fin 402 may be characterized with $T_{p3}'$; a corner angle between a sidewall of the air gap 1302 (in contact with the top gate spacer 1002) and a sidewall of the air gap (in contact with the neighboring channel 2002) may be characterized with $\theta_{p1}'$; and a corner angle between the sidewall of the air gap 1302 (in contact with the top gate spacer 1002) and a sidewall of the air gap (in contact with the semiconductor fin 402) may be characterized with $\theta_{p2}'$.

In some embodiments, an interface between the air gap 1302 and the top gate spacer 1002, in each of the regions 2110 and 2120, may be substantially flat, as illustrated in FIG. 21B. As such, $T_{p1}$ ($T_{p1}'$) and $T_{p3}$ ($T_{p3}'$) are each substantially close to $T_{p2}$ ($T_{p2}'$) (e.g., with a difference equal to or less than 0.5 nm) by controlling various etching conditions to remove the sacrificial gate spacer 802. For instance, a pulse control etching process (e.g., an atomic layer etching process) may be used. Accordingly, $\theta_{p1}$ ($\theta_{p1}'$) and $\theta_{p2}$ ($\theta_{p2}'$) may each be in a range of about 85° and about 95°. Depending on various processing conditions (e.g., etching conditions to removing the protruding portions of the fin 402 discussed in FIG. 11), $T_{p1}$, $T_{p2}$, $T_{p3}$, $T_{p1}'$, $T_{p2}'$, and $T_{p3}'$ can each be in a range from about 0.3 nm to about 30 nm.

In some embodiments, an interface between the air gap 1302 and the top gate spacer 1002, in one of the regions 2110 and 2120, may be substantially flat, and an interface between the air gap 1302 and the top gate spacer 1002, in the other of the regions 2110 and 2120, may outwardly protrude toward the air gap 1302, as illustrated in FIG. 21C. As such, $T_{p1}$ and $T_{p3}$ are each substantially close to $T_{p2}$ (e.g., with a difference equal to or less than 0.5 nm) by controlling various etching conditions to remove the sacrificial gate spacer 802, while $T_{p1}'$ and $T_{p3}'$ are each substantially less than $T_{p2}'$ (e.g., with a difference equal to or greater than 0.5 nm). Accordingly, $\theta_{p1}$ ($\theta_{p1}'$) and $\theta_{p2}$ ($\theta_{p2}'$) may each be in a range of about 30° and about 85°. Depending on various processing conditions (e.g., etching conditions to removing the protruding portions of the fin 402 discussed in FIG. 11), $T_{p1}$, $T_{p2}$, $T_{p3}$, $T_{p1}'$, $T_{p2}'$, and $T_{p3}'$ can each be in a range from about 0.3 nm to about 30 nm.

In some embodiments, an interface between the air gap 1302 and the top gate spacer 1002, in each of the regions 2110 and 2120, may outwardly protrude toward the air gap 1302, as illustrated in FIG. 21D. As such, $T_{p1}$ ($T_{p1}'$) and $T_{p3}$ ($T_{p3}'$) are each substantially less than $T_{p2}$ ($T_{p2}'$) (e.g., with a difference equal to or greater than 0.5 nm). Accordingly, $\theta_{p1}$ ($\theta_{p1}'$) and $\theta_{p2}$ ($\theta_{p2}'$) may each be in a range of about 30° and about 85°. Depending on various processing conditions (e.g., etching conditions to removing the protruding portions of the fin 402 discussed in FIG. 11), $T_{p1}$, $T_{p2}$, $T_{p3}$, $T_{p1}'$, $T_{p2}'$, and $T_{p3}'$ can each be in a range from about 0.3 nm to about 30 nm.

As mentioned above, each of the gate spacers 702, 802 and 1002 can be formed as a multi-layer stack. FIGS. 22A through 22C illustrate cross-sectional views of various embodiments of the non-planar transistor device 300, in which at least one of the gate spacers is formed as a multi-layer stack. The cross-sectional views of non-planar transistor device 300 in FIGS. 22A-C are cut along cross-section X-X or Y-Y (as indicated in FIG. 13).

In FIG. 22A, the bottom gate spacer 702 includes two layers 702A and 702B. As shown, each of the layers 702A and 702B may have an L-shaped profile, with a lateral portion extending below the air gap 1302 and top gate spacer 1002. It should be noted that the air gap 1302 is formed by removing the sacrificial gate spacer 802, which may be formed as a single layer or a last formed layer of a multi-layer stack. As such, the air gap 1302 may present an I-shaped profile. In FIG. 22B, the sacrificial gate spacer 802 includes two layers 802A and 802B, while only the lower layer 802A is removed to form the air gap 1302. As the layer 802A is not the last formed layer of the gate spacer 802, the air gap 1302 may have an L-shaped profile. In FIG. 22C, the top gate spacer 1002 includes two layers 1002A and 1002B, with one or more of the non-last formed layers (e.g., 1002A) having an L-shaped profile and the last formed layer (e.g., 1002B) having an I-shaped profile.

In FIG. 22A, the bottom gate spacer 702 includes two layers 702A and 702B. As shown, each of the layers 702A and 702B may have an L-shaped profile, with a lateral portion extending below the air gap 1302 and top gate spacer 1002. It should be noted that the air gap 1302 is formed by removing the sacrificial gate spacer 802, which may be formed as a single layer or a last formed layer of a multi-layer stack. As such, the air gap 1302 may present an I-shaped profile. In FIG. 22B, the sacrificial gate spacer 802 includes two layers 802A and 802B, while only the lower layer 802A is removed to form the air gap 1302. As the layer 802A is not the last formed layer of the multi-layer stack 702, the air gap 1302 may have an L-shaped profile. In FIG. 22C, the top gate spacer 1002 includes two layers 1002A and 1002B, with one or more of the non-last formed layers (e.g., 1002A) having an L-shaped profile and the last formed layer (e.g., 1002B) having an I-shaped profile.

Figure 23B:
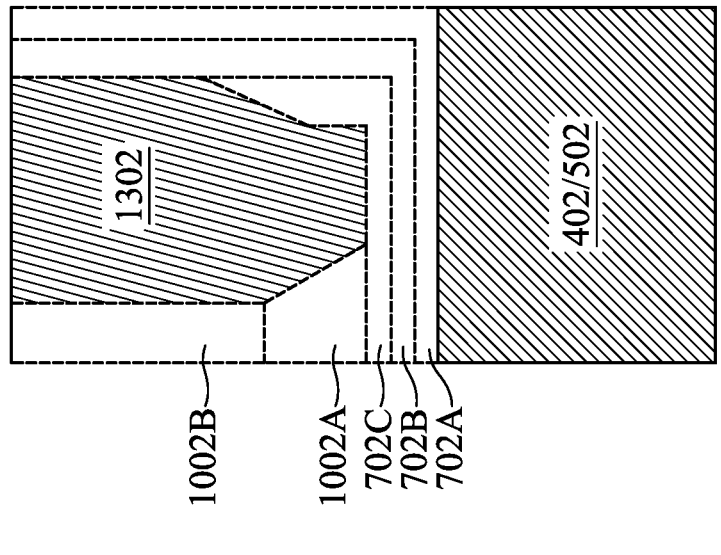
FIGS. 23A and 23B illustrate cross-sectional views of various embodiments of the example non-planar transistor device, made by the method of FIG. 2, in accordance with some embodiments.
Figure 23A:
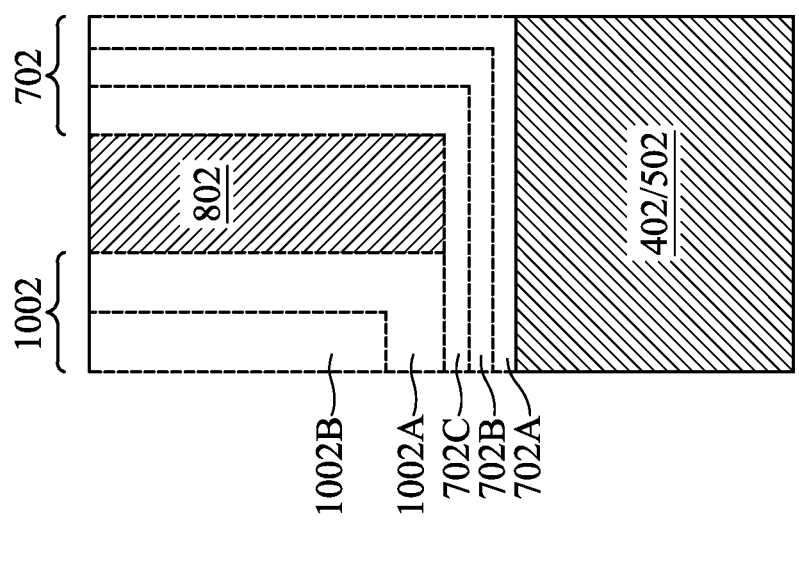

Although the etchants to remove the sacrificial gate spacer 802 can leave the bottom gate spacer and top gate spacer substantially intact (as discussed above), in some scenarios, portions of the bottom and top gate spacers can still be consumed by the etchants. As such, the air gap 1302 may expand the dimension and profile of the sacrificial gate spacer 802. FIGS. 23A-B and illustrate examples where the profile of air gap 1302 has been changed from the profile of the sacrificial gate spacer 802. FIGS. 23A-B each illustrate a cross-sectional view of the non-planar transistor device 300 cut along cross-section X-X or Y-Y (FIG. 13).

In FIGS. 23A-B, the sacrificial gate spacer 802 is sandwiched by bottom gate spacer 702 that includes layers 702A, 702B and 702C, and top gate spacer 1002 that includes layers 1002A and 1002B. Upon the air gap 1302 being formed (by mainly removing the sacrificial gate spacer 802), a portion of the layer 702C of the bottom gate spacer and a portion of the layer 1002A of the top gate spacer are also consumed, which causes the profile of air gap 1302 to expand from the profile of the sacrificial gate spacer 802.

Figure 24A:
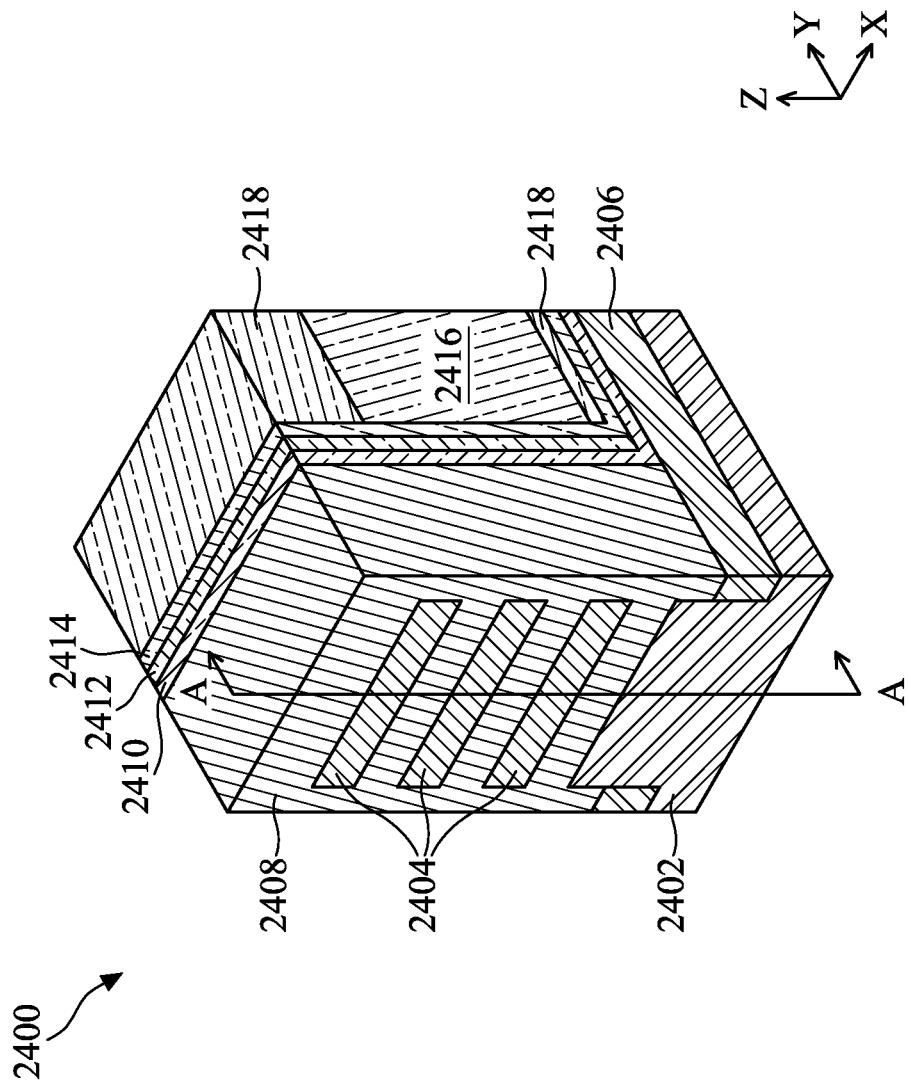
FIG. 24A illustrates a perspective view of an example GAA device, made by at least some of the operations of the method of FIG. 2, in accordance with some embodiments.
Figure 24B:
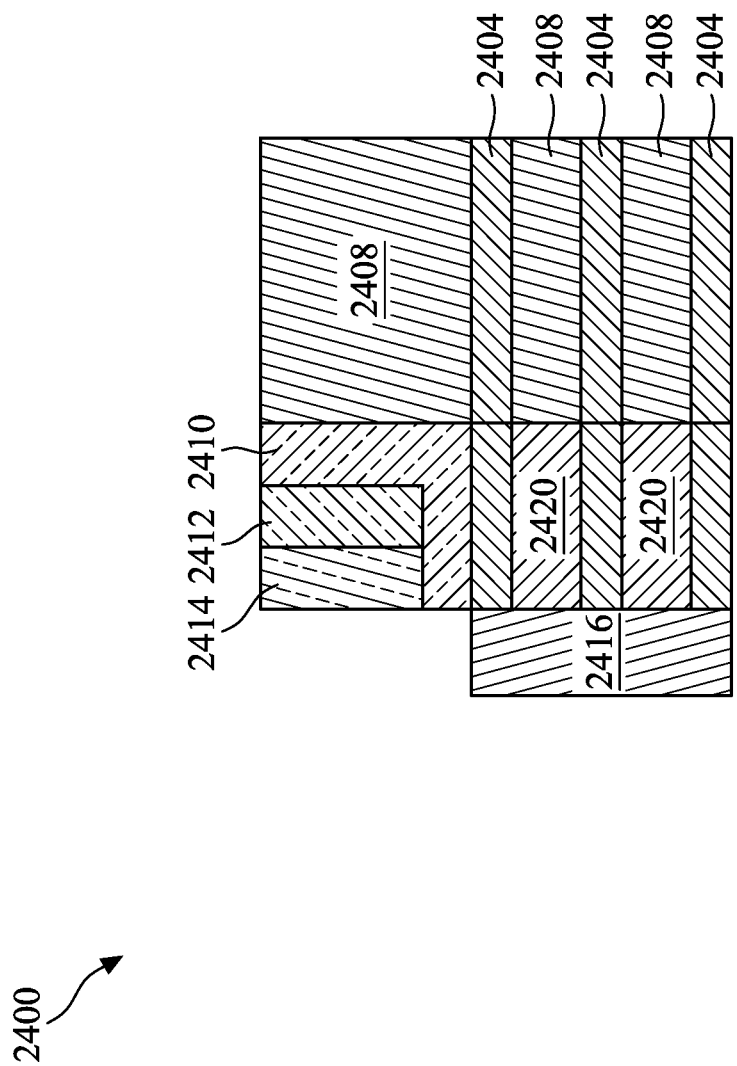
FIG. 24B illustrates a cross-sectional view of the example GAA device shown in FIG. 24A, in accordance with some embodiments.

As mentioned above, at least some of the operations of the disclosed method 200 can also be used to make a GAA transistor device. FIG. 24A depicts a perspective view of a GAA transistor device 2400, and FIG. 24B depicts a cross-sectional view of the GAA transistor device 2400. The cross-sectional view of FIG. 24B is cut along cross-section A-A (FIG. 24A).

As shown in FIG. 24A, the GAA transistor device 2400 includes a substrate 2402 and a number of semiconductor layers (e.g., nanosheets, nanowires, or otherwise nanostructures) 2404 above the substrate 2402. The semiconductor layers 2404 are vertically separated from one another, which can collectively function as a (conduction) channel of the GAA transistor device 2400. Isolation regions/structures 2406 are formed on opposing sides of a protruding portion of the substrate 2402, with the semiconductor layers 2404 disposed above the protruding portion. A gate structure 2408 wraps around each of the semiconductor layers 2404 (e.g., wrapping a perimeter of each of the semiconductor layers 2404). A bottom gate spacer 2410 and a top gate spacer 2414 are disposed on one side of the gate structure 2408, with an air gap 2412 interposed therebetween. A source/drain structure 2416 is disposed on one side of the gate structure 2408 with the gate spacers 2410 and 2414 and the air gap 2412 disposed therebetween. An interlayer dielectric (ILD) 2418 is disposed over the source/drain structure 2416 and/or between the source/drain structure 2416 and the top gate spacer 2414. As further shown in FIG. 24B, the air gap 2412 is isolated from the source/drain structure 2416 with at least the top gate spacer 2414. Further, the GAA transistor device 2400 includes a number of inner spacers 2420, each of which is disposed between adjacent ones of the semiconductor layers 2404.

In one aspect of the present disclosure, a semiconductor device is disclosed. The semiconductor device includes a channel structure, extending along a first lateral direction, that is disposed over a substrate. The semiconductor device includes a gate structure, extending along a second lateral direction perpendicular to the first lateral direction, that straddles the channel structure. The semiconductor device includes an epitaxial structure, coupled to the channel structure, that is disposed next to the gate structure. The semiconductor device includes a first gate spacer and a second gate spacer each comprising a first portion disposed between the gate structure and the epitaxial structure along the first lateral direction. The semiconductor device includes an air gap interposed between the first portion of the first gate spacer and the first portion of the second gate spacer. The air gap exposes a second portion of the first gate spacer that extends in the first lateral direction.

In another aspect of the present disclosure, a semiconductor device is disclosed. The semiconductor device includes a gate structure extending along a first lateral direction. The semiconductor device includes a source/drain structure disposed on one side of the gate structure along a second lateral direction. The second lateral direction is perpendicular to the first lateral direction. The semiconductor device includes a first gate spacer comprising a first portion extending along a vertical direction and a second portion extending along the second lateral direction. The first portion of the first gate spacer is interposed between the gate structure and the source/drain structure along the second lateral direction. The semiconductor device includes a second gate spacer comprising a first portion extending along a vertical direction and a second portion extending along the second lateral direction. The first portion of the second gate spacer is interposed between the gate structure and the source/drain structure along the second lateral direction. The semiconductor device includes an air gap interposed between the respective first portions of the first and second gate spacers. The air gap exposes a portion of a major surface of the second portion of the first gate spacer with a remaining portion of the major surface in contact with the second portion of the second gate spacer.

In yet another aspect of the present disclosure, a method for fabricating semiconductor devices is disclosed. The method includes forming a channel structure over a substrate, wherein the channel structure extends along a first lateral direction. The method includes forming a gate structure extending along a second lateral direction to straddle a portion of the channel structure. The method includes forming a first gate spacer straddling a remaining portion of the channel structure. The method includes forming a sacrificial gate spacer over the first gate spacer. The method includes patterning the sacrificial gate spacer to expose a portion of the first gate spacer that extends along the first lateral direction. The method includes forming a second gate spacer over the sacrificial gate spacer and the exposed portion of the first gate spacer. The method includes removing the patterned sacrificial gate spacer to form an air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a channel structure, extending along a first lateral direction, that is disposed over a substrate;
   a gate structure, extending along a second lateral direction perpendicular to the first lateral direction, that straddles the channel structure;
   an epitaxial structure, coupled to the channel structure, that is disposed next to the gate structure;
   a first gate spacer and a second gate spacer each comprising a first portion disposed between the gate structure and the epitaxial structure along the first lateral direction; and
   an air gap interposed between the first portion of the first gate spacer and the first portion of the second gate spacer;
   wherein the air gap exposes a second portion of the first gate spacer that extends in the first lateral direction, wherein the second gate spacer further comprises a second portion that extends in the first lateral direction, and wherein the second portion of the first gate spacer and the second portion of the second gate spacer, disposed below the epitaxial structure, are in direct contact with each other.

2. The semiconductor device of claim 1, wherein each of the first gate spacer and second gate spacer forms an L-shaped profile.

3. The semiconductor device of claim 1, wherein the air gap extends only along a vertical direction.

4. The semiconductor device of claim 1, wherein the air gap comprises a footing portion extending into the second gate spacer along the second lateral direction.

5. The semiconductor device of claim 1, wherein the air gap is separated from the channel structure with the first gate spacer.

6. The semiconductor device of claim 1, further comprising an interlayer dielectric (ILD) disposed over the epitaxial structure.

7. The semiconductor device of claim 6, wherein the air gap is isolated from the ILD with the second gate spacer.

8. The semiconductor device of claim 1, wherein at least one interface between the second gate spacer and the air gap has a curvature-based profile.

9. The semiconductor device of claim 8, wherein the curvature-based profile protrudes toward the air gap.

10. A semiconductor device, comprising:
    a gate structure extending along a first lateral direction;
    a source/drain structure disposed on one side of the gate structure along a second lateral direction, the second lateral direction perpendicular to the first lateral direction;
    a first gate spacer comprising a first portion extending along a vertical direction and a second portion extending along the second lateral direction, wherein the first portion of the first gate spacer is interposed between the gate structure and the source/drain structure along the second lateral direction;
    a second gate spacer comprising a first portion extending along a vertical direction and a second portion extending along the second lateral direction, wherein the first portion of the second gate spacer is interposed between the gate structure and the source/drain structure along the second lateral direction; and
    an air gap interposed between the respective first portions of the first and second gate spacers, wherein the air gap exposes a portion of a major surface of the second portion of the first gate spacer with a remaining portion of the major surface in contact with the second portion of the second gate spacer.

11. The semiconductor device of claim 10, wherein the air gap extends only along the vertical direction.

12. The semiconductor device of claim 10, further comprising an interlayer dielectric (ILD) disposed over the source/drain structure.

13. The semiconductor device of claim 12, wherein the air gap is isolated from the ILD with the first portion of the second gate spacer.

14. The semiconductor device of claim 10, wherein the second portion of the first gate spacer and the second portion of the second gate spacer are both disposed below the source/drain structure.

15. The semiconductor device of claim 10, further comprising a plurality of nanostructures separated from one another along the vertical direction, each of the plurality of nanostructures extending along the second lateral direction.

16. The semiconductor device of claim 15, wherein the gate structure wraps around each of the plurality of nanostructures, and wherein the source/drain structure is coupled to one end of each of the plurality of nanostructures.

17. The semiconductor device of claim 10, wherein the air gap is separated from a topmost one of the plurality of nanostructures with the first gate spacer.

18. A method for fabricating semiconductor devices, comprising:
- forming a channel structure over a substrate, wherein the channel structure extends along a first lateral direction;
- forming a gate structure extending along a second lateral direction to straddle a portion of the channel structure;
- forming a first gate spacer straddling a remaining portion of the channel structure;
- forming a sacrificial gate spacer over the first gate spacer;
- patterning the sacrificial gate spacer to expose a portion of the first gate spacer that extends along the first lateral direction;
- forming a second gate spacer over the sacrificial gate spacer and the exposed portion of the first gate spacer; and
- removing the patterned sacrificial gate spacer to form an air gap.

19. The method of claim 18, prior to the step of removing the patterned sacrificial gate spacer, further comprising:
- removing a portion of the remaining portion of the channel structure and respective portions of the first gate spacer and the second gate spacer overlaying such a portion of the remaining portion of the channel structure;
- growing an epitaxial structure coupled to the channel structure, wherein the epitaxial structure is isolated from the patterned sacrificial gate spacer with a vertical portion of the second gate spacer; and
- overlaying the epitaxial structure with a dielectric material.

20. The method of claim 18, wherein at least one interface between the second gate spacer and the air gap has a curvature-based profile.

* * * * *